US012813329B2

(12) United States Patent
Lee et al.

(10) Patent No.: US 12,813,329 B2
(45) Date of Patent: Nov. 24, 2026

(54) SEMICONDUCTOR PACKAGES COMPRISING HEAT SPREADERS

(71) Applicant: SAMSUNG ELECTRONICS CO., LTD., Suwon-si (KR)

(72) Inventors: Jun Ho Lee, Suwon-si (KR); Hyo Eun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 332 days.

(21) Appl. No.: 18/483,312

(22) Filed: Oct. 9, 2023

(65) Prior Publication Data

US 2024/0153834 A1 May 9, 2024

(30) Foreign Application Priority Data

Nov. 7, 2022 (KR) ........................ 10-2022-0147052

(51) Int. Cl.
*H10W 76/42* (2026.01)
*H10W 20/20* (2026.01)
(Continued)

(52) U.S. Cl.
CPC ........... *H10W 76/42* (2026.01); *H10W 20/20* (2026.01); *H10W 40/22* (2026.01);
(Continued)

(58) Field of Classification Search
CPC ..... H10W 76/42; H10W 20/20; H10W 40/22; H10W 74/137; H10W 90/00;
(Continued)

(56) References Cited

U.S. PATENT DOCUMENTS

| | | | |
|---|---|---|---|
| 6,229,702 | B1 | 5/2001 | Tao et al. |
| 6,559,525 | B2 | 5/2003 | Huang |

(Continued)

FOREIGN PATENT DOCUMENTS

| | | | |
|---|---|---|---|
| KR | 10-2013-0133167 | A | 12/2013 |
| KR | 10-2016-0031408 | A | 3/2016 |
| KR | 10-2021-0081891 | A | 7/2021 |

OTHER PUBLICATIONS

Charles, Roody , et al., “A novel heat dissipation fin design applicable for natural convection augmentation”, International Communications in Heat and Mass Transfer, vol. 59, Dec. 2014, pp. 24-29.

(Continued)

*Primary Examiner* — Caleb E Henry
(74) *Attorney, Agent, or Firm* — Wolf, Greenfield & Sacks, P.C.

(57) ABSTRACT

A semiconductor package is provided. The semiconductor package comprises a first semiconductor chip including a first semiconductor substrate, a through-via in the first semiconductor substrate, a second semiconductor chip on the first semiconductor chip, a filler structure extending from a top surface of the first semiconductor chip into the first semiconductor chip, and a heat spreader including a column portion spaced apart from the second semiconductor chip and disposed on the filler structure and a roof portion disposed on the second semiconductor chip and connected to the column portion.

20 Claims, 29 Drawing Sheets

(51) Int. Cl.
*H10W 40/22* (2026.01)
*H10W 72/20* (2026.01)
*H10W 74/10* (2026.01)
*H10W 74/15* (2026.01)
*H10W 90/00* (2026.01)

(52) U.S. Cl.
CPC ......... *H10W 74/137* (2026.01); *H10W 90/00* (2026.01); *H10W 72/248* (2026.01); *H10W 74/15* (2026.01); *H10W 90/722* (2026.01); *H10W 90/724* (2026.01); *H10W 90/734* (2026.01)

(58) Field of Classification Search
CPC . H10W 72/248; H10W 74/15; H10W 90/722; H10W 90/724; H10W 90/734; H10W 90/288; H10W 90/297; H10W 72/30; H01L 23/481; H01L 24/32; H01L 25/0657; H01L 23/367; H01L 2225/06513; H01L 2225/06517; H01L 2225/06541; H01L 2225/06589; H01L 23/3128; H01L 21/565; H01L 21/6835; H01L 23/142; H01L 23/147; H01L 23/3114; H01L 23/49816; H01L 23/49827; H01L 23/5383; H01L 23/5384; H01L 24/14; H01L 24/17; H01L 2221/68345; H01L 2221/68359; H01L 2224/73204; H01L 2924/181; H01L 2224/92125; H01L 21/4857; H01L 21/50; H01L 24/11; H01L 2224/113; H01L 2224/141; H01L 2224/1412; H01L 24/27; H01L 24/97; H10K 59/8723; H10K 59/8722; H10K 71/00; H10K 59/871
See application file for complete search history.

(56) References Cited

U.S. PATENT DOCUMENTS 9,570,478 B2* 2/2017 Kim .................. G02F 1/133345
9,818,720 B2* 11/2017 Wei .................. H01L 25/0652
9,851,606 B2* 12/2017 Cha .................. G02F 1/1339
9,971,205 B2* 5/2018 Huang .................. G02F 1/13394
10,134,708 B2* 11/2018 Yu .................. H01L 24/17
10,197,842 B2* 2/2019 Kobayashi .................. G02F 1/13439
10,297,550 B2* 5/2019 Hu .................. H01L 23/5389
10,916,527 B2 2/2021 Vadhavkar et al.
11,164,855 B2* 11/2021 Chen .................. H01L 21/6835
11,205,623 B2 12/2021 Tarui et al.
11,450,581 B2* 9/2022 Lo .................. H01L 25/0655
11,848,246 B2* 12/2023 Chen .................. H01L 21/56
12,512,331 B2* 12/2025 Kuo .................. H10W 70/095
2011/0090445 A1* 4/2011 Kim .................. G02F 1/1339
349/139
2011/0294260 A1* 12/2011 Hwang .................. H10W 20/20
257/E21.505
2014/0320789 A1* 10/2014 Son .................. G02F 1/133345
156/60
2015/0130058 A1* 5/2015 Chen .................. H01L 21/6835
257/737
2015/0137345 A1 5/2015 Choi et al.
2015/0179590 A1* 6/2015 Fu .................. H01L 23/49838
257/737
2016/0099213 A1* 4/2016 Tae .................. H10W 70/614
257/777
2016/0372449 A1* 12/2016 Rusu .................. H01L 25/18
2018/0138145 A1* 5/2018 Lin .................. H10W 20/20
2018/0204810 A1* 7/2018 Yu .................. H01L 21/561
2018/0350779 A1* 12/2018 Choi .................. H10W 74/012
2018/0356697 A1* 12/2018 Ni .................. H10D 86/60
2021/0050300 A1* 2/2021 Lin .................. H01L 23/5382
2021/0111094 A1 4/2021 Kim et al.
2021/0242105 A1 8/2021 Reyes Schuldes et al.
2022/0139881 A1 5/2022 Song et al.
2022/0157692 A1 5/2022 Wang et al.
2023/0124758 A1* 4/2023 Fiteri .................. H01L 25/18
257/777
2023/0124783 A1* 4/2023 Kim .................. H01L 23/473
257/712
2023/0148220 A1* 5/2023 Verhaverbeke ..... H01L 23/5389
257/690
2023/0154913 A1* 5/2023 Tsai .................. H01L 25/50
438/666
2023/0170327 A1* 6/2023 Yang .................. H01L 25/0652
257/737
2023/0180379 A1* 6/2023 Mardi .................. H01L 23/40
361/719
2023/0189538 A1* 6/2023 Or-Bach ............ G11C 29/1201
2023/0197697 A1* 6/2023 Pietambaram .......... H01L 23/15
257/668
2023/0207414 A1* 6/2023 Cho .................. H01L 21/6835
257/668
2023/0207417 A1* 6/2023 Cho .................. H01L 25/105
257/690
2023/0317551 A1* 10/2023 Prasad .................. H01L 25/18
257/675
2023/0317621 A1* 10/2023 Waidhas .................. H01L 23/15
2023/0411234 A1* 12/2023 Yeh .................. H01L 23/42
2024/0006341 A1* 1/2024 Cheah .................. H01L 23/5385
2024/0006399 A1* 1/2024 Lim .................. H01L 23/5389
2024/0063180 A1* 2/2024 Jun .................. H01L 23/5385
2024/0105545 A1* 3/2024 Lu .................. H01L 24/08
2024/0105704 A1* 3/2024 Zhong .................. H10D 1/68
2024/0112981 A1* 4/2024 Kim .................. H01L 23/481
2025/0040141 A1* 1/2025 Or-Bach .................. H01L 24/33
2025/0318149 A1* 10/2025 Or-Bach .................. H01L 24/33
2025/0349629 A1* 11/2025 Pan .................. H01L 25/16
2025/0349798 A1* 11/2025 Colgan .................. H01L 23/5385
2025/0357247 A1* 11/2025 Or-Bach ............ H01L 21/6835

OTHER PUBLICATIONS

Kumar, G. Udaya , et al., “A review on the role of laser textured surfaces on boiling heat transfer”, Applied Thermal Engineering, vol. 174, Jun. 2020, 28 pp.
Lee, Jeong Seok , et al., “Efficient heat dissipation by ion-mediation assembled reduced graphene oxide”, Journal of Materials Chemistry C, vol. 6, Feb. 2, 2018, pp. 2515-2521.
Rho, Hokyun , et al., “Three-Dimensional Porous Copper-Graphene Heterostructures with Durability and High Heat Dissipation Performance”, Scientific Report, vol. 5, Article No. 12710, Aug. 3, 2015, 7 pp.
You, Yuxin , et al., “Effect of Surface Microstructure on the Heat Dissipation Performance of Heat Sinks Used in Electronic Devices”, Micromachines, vol. 12, Issue 3, Mar. 4, 2021, 12 pp.

* cited by examiner

SEMICONDUCTOR PACKAGES COMPRISING HEAT SPREADERS

CROSS-REFERENCE TO RELATED APPLICATION

This application claims priority to Korean Patent Application No. 10-2022-0147052 filed on Nov. 7, 2022 in the Korean Intellectual Property Office, and all the benefits accruing therefrom under 35 U.S.C. 119, the contents of which in its entirety are herein incorporated by reference.

BACKGROUND

The present disclosure relates to semiconductor packages.

Due to development of the electronic industry, demand for high-functionality, high-speed, and miniaturization of an electronic component is increasing. In response to this trend, a scheme of stacking and mounting several semiconductor chips on one package wiring structure or a scheme of stacking a package on top of a package may be used. For example, a PIP (package-in-package) type semiconductor package or a POP (package-on-package) type semiconductor package may be used. In this regard, it may not be easy to dissipate heat in a highly integrated semiconductor package. Accordingly, a heat spreader or the like may be used to dissipate the heat inside the semiconductor package.

SUMMARY

Technical features of the present disclosure may provide a semiconductor package having improved heat dissipation performance.

According to some aspects of the present inventive concept, there is provided a semiconductor package comprising a first semiconductor chip including a first semiconductor substrate, a through-via in the first semiconductor substrate, a second semiconductor chip disposed on the first semiconductor chip, a filler structure extending from a top surface of the first semiconductor chip into the first semiconductor chip, and a heat spreader including a column portion spaced apart from the second semiconductor chip and disposed on the filler structure and a roof portion disposed on the second semiconductor chip and connected to the column portion.

According to some aspects of the present inventive concept, there is provided a semiconductor package comprising a first semiconductor chip that includes a first semiconductor substrate, a second semiconductor chip on the first semiconductor chip, a through-via in the first semiconductor substrate, a filler structure extending from a top surface of the first semiconductor chip into the first semiconductor chip, wherein the filler structure does not overlap with the through-via, and a heat spreader including a column portion disposed on the filler structure, wherein the column portion is spaced apart from the second semiconductor chip, a roof portion contacting a top surface of the second semiconductor chip and connected to the column portion, and a protrusion protruding upwardly from a top surface of the roof portion.

According to some aspects of the present inventive concept, there is provided a semiconductor package comprising a package substrate, a first semiconductor chip disposed on the package substrate and including a through-via, an underfill between the package substrate and the first semiconductor chip, a second semiconductor chip disposed on the first semiconductor chip, a filler structure extending through the first semiconductor chip, wherein the filler structure is spaced apart from the through-via, a dummy bump in the underfill, wherein the filler structure is on the dummy bump, a heat spreader including a column portion disposed on the filler structure; a roof portion contacting a top surface of the second semiconductor chip, wherein the roof portion is connected to the column portion; and a mold layer between the roof portion and the first semiconductor chip, wherein the mold layer is between the second semiconductor chip and the column portion, wherein the heat spreader includes a protrusion protruding from a top surface of the roof portion, wherein the filler structure includes an extension extending in the first semiconductor chip and a contact portion disposed on the extension and contacting the column portion, wherein the extension contacts the dummy bump, wherein the dummy bump is electrically insulated from the package substrate.

The present disclosure is not limited to the above-mentioned embodiments. Other features and advantages according to the present disclosure that are not mentioned may be understood based on following descriptions, and may be more clearly understood based on other embodiments according to the present disclosure. Further, it will be easily understood that the features and advantages according to the present disclosure may be realized using means shown in the claims or combinations thereof.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

Figure 1:
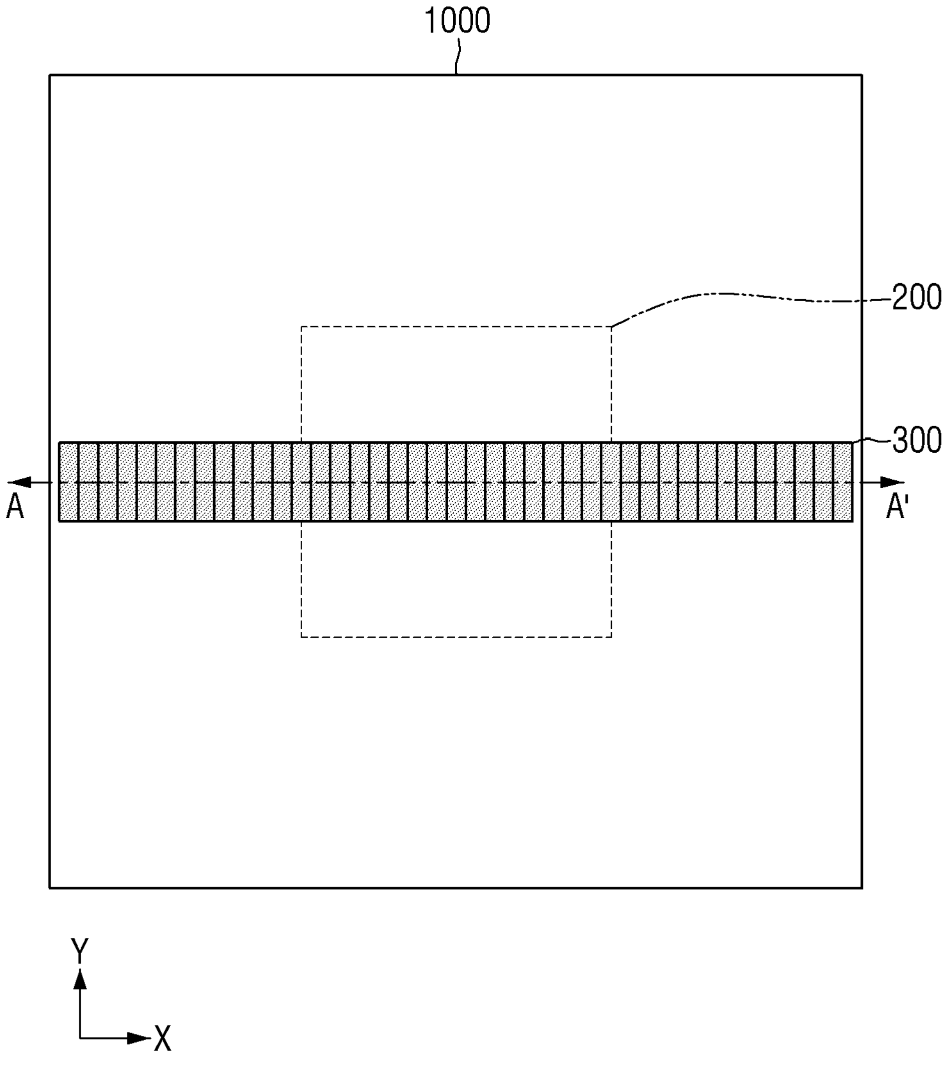
FIG. 1 is a plan view for illustrating a semiconductor package according to some embodiments.

For simplicity and clarity of illustration, elements in the drawings may not be necessarily drawn to scale. The same reference numbers in different drawings may represent the same or similar elements, and as such may perform similar functionality. Further, descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits may not be described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals may refer to the same elements herein. Further, descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits may not be described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. When referring to "C to D", this means C inclusive to D inclusive unless otherwise specified.

It will be understood that, although the terms "first", "second", "third", and so on may be used herein to illustrate various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is disposed "directly on" or "directly on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is disposed "directly below" or "directly under" another layer, film, region, plate, or the like, the former directly contacts the latter and still another layer, film, region, plate, or the like is not disposed between the former and the latter.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence. Moreover, the function or operation in the specific block (e.g., step) may be separated into multiple blocks (e.g., steps) and/or may be at least partially integrated.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms “below” and “under” may encompass both an orientation of above and below. The device may be otherwise oriented, for example, rotated 90 degrees or at other orientations, and the spatially relative descriptors used herein should be interpreted accordingly.

Hereinafter, embodiments according to the technical idea of the present disclosure will be described with reference to the accompanying drawings.

Figure 2:
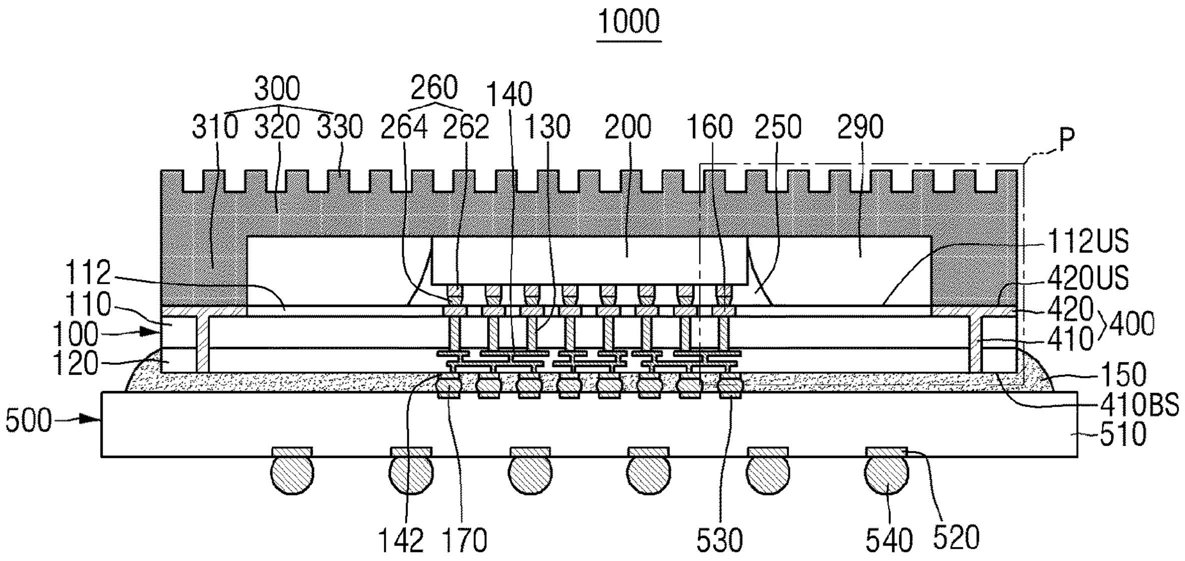
FIG. 2 is a cross-sectional view taken along a line A-A' of FIG. 1.
Figure 3:
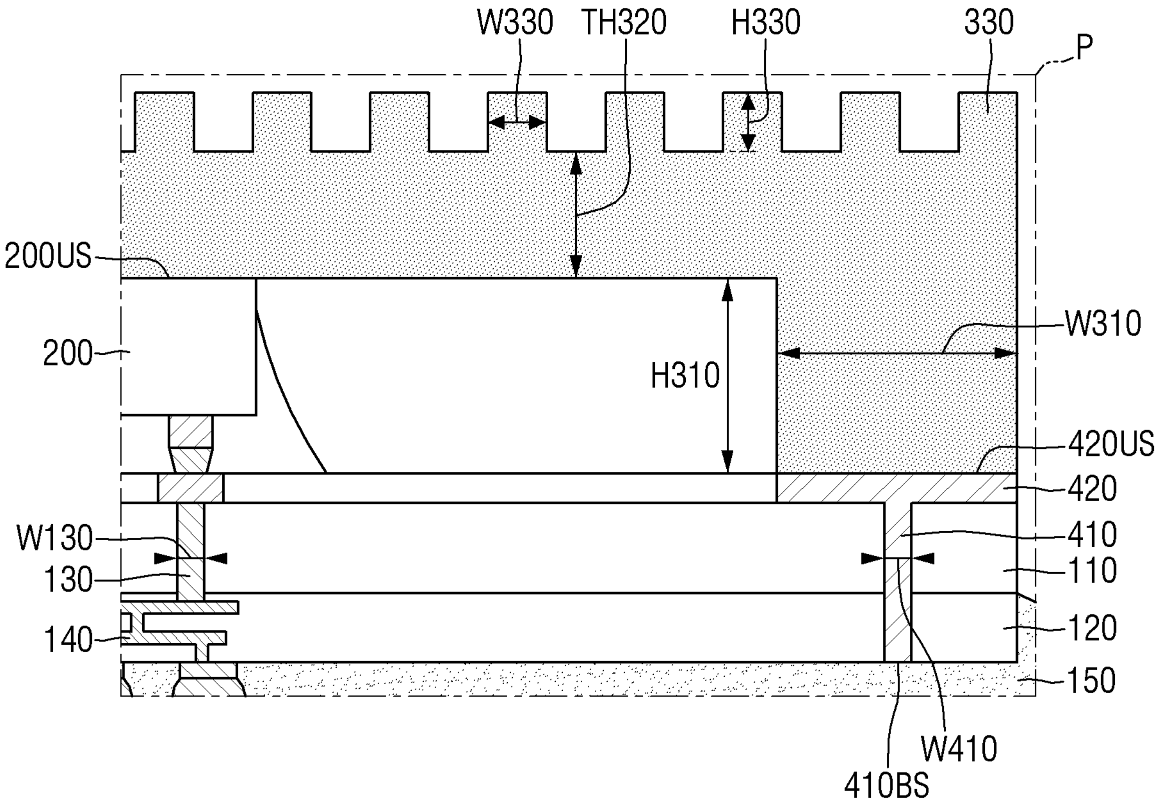
FIG. 3 is an enlarged view showing a P portion of FIG. 2.

FIG. 1 is a plan view for illustrating a semiconductor package according to some embodiments. FIG. 2 is a cross-sectional view taken along a line A-A' of FIG. 1. FIG. 3 is an enlarged view showing a P portion of FIG. 2.

Referring to FIG. 1 to FIG. 3, a semiconductor package 1000 according to some embodiments may include a first semiconductor chip 100, a second semiconductor chip 200, a heat spreader 300, a filler structure 400. The package substrate 500 may also be referred to as a base substrate 500.

Each of the first semiconductor chip 100 and the second semiconductor chip 200 may be a logic chip or a memory chip. The first semiconductor chip 100 and the second semiconductor chip 200 may be of the same type. For example, each of the first semiconductor chip 100 and the second semiconductor chip 200 may be a volatile memory chip such as DRAM (dynamic random access memory) or SRAM (static random access memory). In another example, each of the first semiconductor chip 100 and the second semiconductor chip 200 may be a nonvolatile memory chip such as PRAM (phase-change random access memory), MRAM (magnetoresistive random access memory), FeRAM (ferroelectric random access memory), or RRAM (resistive random access memory). In still another example, each of the first semiconductor chip 100 and the second semiconductor chip 200 may be a HBM (high bandwidth memory).

In some embodiments, one of the first semiconductor chip 100 and the second semiconductor chip 200 may be a memory chip and the other thereof may be a logic chip. For example, one of the first semiconductor chip 100 and the second semiconductor chip 200 may be a microprocessor, an analog device, a digital signal processor, an application processor, or the like.

The first semiconductor chip 100 may be stacked on the base substrate 500 in a vertical direction perpendicular to a bottom (or top) surface of the first semiconductor chip 100. The first semiconductor chip 100 may be electrically connected to the base substrate 500 via a first connection bump 170.

A first underfill 150 may be disposed on the bottom surface of the first semiconductor chip 100. The first underfill 150 may be disposed between the first semiconductor chip 100 and the base substrate 500. In this regard, the first underfill 150 may include a non-conductive film. A second underfill 250 may be disposed between the first semiconductor chip 100 and the second semiconductor chip 200. Similarly, the second underfill 250 may include a non-conductive film.

The first semiconductor chip 100 may include a first semiconductor substrate 110, a first semiconductor device layer 120, a through-via 130, a first lower connection pad 142, an upper passivation film 112, a first upper connection pad 160 and a first connection bump 170.

The first semiconductor substrate 110 may be, for example, bulk silicon or SOI (silicon-on-insulator). The first semiconductor substrate 110 may be, for example, a silicon substrate. The first semiconductor substrate 110 may include, but is not limited to, silicon germanium, SGOI (silicon germanium on insulator), indium antimonide, a lead telluride compound, indium arsenide, indium phosphide, gallium arsenide, or gallium antimonide.

The first semiconductor substrate 110 may include a conductive area, for example, a well doped with impurities or a structure doped with impurities. The first semiconductor substrate 110 may have various device isolation structures such as an STI (shallow trench isolation) structure.

The first semiconductor device layer 120 may be disposed on a bottom surface of the first semiconductor substrate 110. The first semiconductor device layer 120 may include a plurality of individual devices of various types, and an interlayer insulating film. The individual devices may include various microelectronic devices, for example, a MOSFET (metal-oxide-semiconductor field effect transistor) such as a CMOS transistor (complementary metal-insulator-semiconductor transistor), a system LSI (large scale integration), a flash memory, a DRAM, a SRAM, an EEPROM (electrically erasable programmable read-only memory), a PRAM, a MRAM, a RRAM, an image sensor such as a CIS (CMOS imaging sensor), a MEMS (micro-electro-mechanical system), an active device, a passive device, etc.

The individual devices of the first semiconductor device layer 120 may be electrically connected to the conductive area formed in the first semiconductor substrate 110. Each of the individual devices of the first semiconductor device layer 120 may be electrically isolated from each of other individual devices adjacent thereto via each of various device isolation structures such as insulating films. The first semiconductor device layer 120 may include a first wiring structure 140 electrically connecting at least two of the plurality of individual devices or the plurality of individual devices of the first semiconductor device layer 120 to the conductive area of the first semiconductor substrate 110.

Although not shown, a lower passivation layer may be formed on the first semiconductor device layer 120 so as to protect the first wiring structure 140 and other structures in the first semiconductor device layer 120 from external shock or moisture. The lower passivation layer may not cover a portion of a top surface and/or a portion of a bottom surface of the first lower connection pad 142.

The through-via 130 may extend through the first semiconductor substrate 110. The through-via 130 may extend from a top surface of the first semiconductor substrate 110 toward a bottom surface thereof. The through-via 130 may be electrically connected to the first wiring structure 140 disposed in the first semiconductor device layer 120.

The through-via 130 may be disposed on the first wiring structure 140. The first wiring structure 140 may face the package substrate 500.

The through-via 130 may include a barrier film constituting a surface of a columnar shape and a buried conductive layer filling an inner space defined by the barrier film. However, the shape and composition of the through-via 130 are not limited thereto. The barrier film may include, for example, Ti, TiN, Ta, TaN, Ru, Co, Mn, WN, Ni, and/or NiB. However, the present disclosure is not limited thereto. The buried conductive layer may include, for example, a Cu alloy such as Cu, CuSn, CuMg, CuNi, CuZn, CuPd, CuAu, CuRe, CuW, W, W alloy, Ni, Ru, and/or Co. However, the present disclosure is not limited thereto.

In some embodiments, an insulating film may be interposed between the first semiconductor substrate 110 and the through-via 130. The insulating film may include an oxide film, a nitride film, a carbide film, a polymer, or a combination thereof. However, the present disclosure is not limited thereto.

The first wiring structure 140 may include a metal wiring layer and a via plug. For example, the first wiring structure 140 may be a multi-layer structure in which two or more metal wiring layers and two or more via plugs are alternately stacked on top of each other.

The first lower connection pad 142 may be disposed on the first semiconductor device layer 120 (e.g., a bottom surface of the first semiconductor device layer 120). The first lower connection pad 142 may be electrically connected to the first wiring structure 140 disposed inside the first semiconductor device layer 120. The first lower connection pad 142 may be electrically connected to the through-via 130 via the first wiring structure 140. The first lower connection pad 142 may include, for example, aluminum (Al), copper (Cu), nickel (Ni), tungsten (W), platinum (Pt), and/or gold (Au).

The first upper connection pad 160 electrically connected to the through-via 130 may be formed on a top surface of the first semiconductor substrate 110. The first upper connection pad 160 may be made of the same material as the first lower connection pad 142, but is not limited thereto.

The first upper connection pad 160 may be disposed at least partially within the upper passivation film 112. The upper passivation film 112 may be adjacent to and extend around (e.g., surround) the first upper connection pad 160.

The first connection bump 170 may be in contact with the first lower connection pad 142. The first connection bump 170 may electrically connect the first semiconductor chip 100 to the base substrate 500. The first connection bump 170 may receive, for example, a control signal, a power signal, and/or a ground signal for an operation of the first semiconductor chip 100 from an external device. The first connection bump 170 may receive a data signal to be stored in the first semiconductor chip 100 from the external device. The first connection bump 170 may provide data stored in the first semiconductor chip 100 to the external device. For example, the first connection bump 170 may include a pillar structure, a ball structure, or a solder layer, but is not limited thereto.

The upper passivation film 112 and the first upper connection pad 160 may be formed on the top surface of the first semiconductor substrate 110. The upper passivation film 112 may cover a portion of the top surface of the first semiconductor substrate 110 and may not cover a top surface of the first upper connection pad 160.

In some embodiments, the first upper connection pad 160 may be electrically connected to the first lower connection pad 142. For example, the first upper connection pad 160 may be electrically connected to the first lower connection pad 142 via the through-via 130 and the first wiring structure 140.

The upper passivation film 112 may include, for example, a photosensitive insulating material (e.g., PID; photoimageable dielectric). However, the present disclosure is not limited thereto.

The second semiconductor chip 200 may be disposed on the first semiconductor chip 100. For example, the second semiconductor chip 200 may be mounted on a top surface of the first semiconductor chip 100. The second semiconductor chip 200 may be an integrated circuit (IC) in which hundreds to millions of semiconductor devices are integrated into one chip.

For example, the second semiconductor chip 200 may be an application processor (AP), a CPU (Central Processing Unit), a GPU (Graphic Processing Unit), a FPGA (Field-Programmable Gate Array), a digital signal processor, a cryptographic processor, a microprocessor, a microcontroller, etc. However, the present disclosure is not limited thereto.

In some embodiments, the second semiconductor chip 200 may be a logic chip such as an ADC (Analog-Digital Converter) or an ASIC (Application-Specific IC) or may be a memory chip such as a volatile memory such as DRAM or a non-volatile memory such as ROM (read-only memory) or flash memory. The second semiconductor chip 200 may be a combination of a logic chip and a memory chip.

Although it is illustrated that only one second semiconductor chip 200 is formed on the first semiconductor chip 100, this is intended only for convenience of illustration. For example, a plurality of semiconductor chips may be arranged side by side while being disposed on the first semiconductor chip 100. In some embodiments, a plurality of semiconductor chips may be sequentially stacked on the first semiconductor chip 100.

In some embodiments, the second semiconductor chip 200 may be mounted on the first semiconductor chip 100 using a flip chip bonding scheme. For example, a second connection bump 260 may be formed between the top surface of the first semiconductor chip 100 and a bottom surface of the second semiconductor chip 200. The second connection bump 260 may electrically connect the first semiconductor chip 100 and the second semiconductor chip 200 to each other.

The second connection bump 260 may include, for example, a first pillar layer 262 and a first solder layer 264.

The first pillar layer 262 may protrude from the bottom surface of the second semiconductor chip 200. The first pillar layer 262 may include, for example, copper (Cu), copper alloy, nickel (Ni), palladium (Pd), platinum (Pt), gold (Au), cobalt (Co), or combinations thereof. However, the present disclosure is not limited thereto.

The first solder layer 264 may connect the first pillar layer 262 and the first semiconductor chip 100 to each other. For example, the first solder layer 264 may be connected to some of the first upper connection pads 160. The first solder layer 264 may have, for example, a spherical or elliptical cross-sectional shape. However, the present disclosure is not limited thereto. The first solder layer 264 may include, for example, tin (Sn), indium (In), bismuth (Bi), antimony (Sb), copper (Cu), silver (Ag), zinc (Zn), lead (Pb), or combinations thereof. However, the present disclosure is not limited thereto.

The second underfill 250 may be formed on the first semiconductor chip 100. The second underfill 250 may fill an area between the first semiconductor chip 100 and the second semiconductor chip 200. The second underfill 250 may fix the second semiconductor chip 200 onto the first semiconductor chip 100 to prevent the second semiconductor chip 200 from being broken. The second underfill 250 may cover a portion of the second connection bump 260. The second connection bump 260 may extend through the second underfill 250 so as to electrically connect the first semiconductor chip 100 and the second semiconductor chip 200 to each other.

The second underfill 250 may include, but is not limited to, an insulating polymer material such as EMC (epoxy molding compound). In some embodiments, the second underfill 250 may include a material different from that of a mold layer 290 as described below. For example, the second underfill 250 may include an insulating material having fluidity greater than that of the material of the mold layer 290. Accordingly, the second underfill 250 may efficiently fill a narrow space between the first semiconductor chip 100 and the second semiconductor chip 200.

The mold layer 290 may be formed on the first semiconductor chip 100. The mold layer 290 may fill a space between the first semiconductor chip 100 and the heat spreader 300. The mold layer 290 may cover portions of the first semiconductor chip 100 and the second semiconductor chip 200 to protect them.

The mold layer 290 may fill a space between the second semiconductor chip 200 and a column portion 310 of the heat spreader 300. The mold layer 290 may fill a space between a roof portion 320 of the heat spreader 300 and the first semiconductor chip 100.

The mold layer 290 may cover a side surface of the second semiconductor chip 200. Further, the mold layer 290 may not cover the top surface of the second semiconductor chip 200. A top surface of the mold layer 290 may be coplanar with the top surface of the second semiconductor chip 200. The mold layer 290 may contact a bottom surface of the roof portion 320 of the heat spreader 300.

The mold layer 290 may include an insulating polymeric material such as an EMC (epoxy molding compound). The mold layer 290 may include a thermosetting resin such as epoxy resin, a thermoplastic resin such as polyimide, or a resin (for example, ABF, FR-4, or BT resin) including the epoxy resin or polyimide and a reinforcing material such as a filler contained in the epoxy resin or polyimide. However, the embodiments of the mold layer 290 are not limited thereto.

The filler may include, for example, silica ($SiO_2$), alumina ($Al_2O_3$), silicon carbide (SiC), barium sulfate ($BaSO_4$), talc, clay, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($A_1BO_3$), barium titanate ($BaTiO_3$), and/or calcium zirconate ($CaZrO_3$). However, a material of the filler is not limited thereto, and may include a metal material and/or an organic material.

The base substrate 500 may be, for example, a printed circuit board (PCB), a ceramic substrate, or an interposer. In some embodiments, the base substrate 500 may be a semiconductor chip including a semiconductor device. The base substrate 500 may function as a support substrate of a semiconductor package (e.g., semiconductor package 1000). For example, the first semiconductor chip 100 as described above may be stacked on the base substrate 500.

The base substrate 500 may include a substrate body 510, a bottom pad 520, and a top pad 530. The bottom pad 520 may be disposed at a bottom surface of the substrate body 510. The top pad 530 may be disposed at a top surface of the substrate body 510. An external connection terminal 540 may be disposed under the base substrate 500. The external connection terminal 540 may be disposed on the bottom pad 520. For example, the external connection terminal 540 may be a solder ball or a bump, but is not limited thereto.

Although not illustrated, wiring patterns for electrically connecting the bottom pads 520 and the top pads 530 to each other may be formed in the substrate body 510. The substrate body 510 is illustrated as being embodied as a single layer. However, this is intended only for convenience of illustration. In some embodiments, the substrate body 510 may include multiple layers, and the wiring patterns may be formed in each of the multiple layers.

The first underfill 150 may be formed between the base substrate 500 and the first semiconductor chip 100. The first underfill 150 may extend around (e.g., surround) portions of the first connection bump 170 and the first lower connection pad 142 while being disposed between the base substrate 500 and the first semiconductor chip 100.

The first underfill 150 may protrude outwardly from a side surface of the first semiconductor chip 100. A portion of the first underfill 150 that protrudes outwardly from the side surface of the first semiconductor chip 100 may cover a portion of the side surface of the first semiconductor chip 100. A side surface of the portion of the first underfill 150 protruding outwardly from the side surface of the first semiconductor chip 100 may be a curved surface.

At least a portion of a filler structure 400 may be disposed within the first semiconductor chip 100. The filler structure 400 may extend from a top surface of the first semiconductor chip 100 into the first semiconductor chip 100. A portion of the filler structure 400 (e.g., extension 410 described later) may extend in the first semiconductor chip 100. A portion of the filler structure 400 (e.g., extension 410 described later) may extend in the first semiconductor substrate 110 and the first semiconductor device layer 120. The filler structure 400 may include a relatively high thermal conductivity material. For example, the filler structure 400 may include copper (Cu). The filler structure 400 may transfer heat generated in the first semiconductor chip 100 to the heat spreader 300.

The filler structure 400 may include an extension 410 and a contact portion 420. The extension 410 may be disposed under the contact portion 420. The extension 410 may extend in the first semiconductor chip 100. The extension 410 may extend from the top surface of the first semiconductor substrate 110 toward the bottom surface of the first semiconductor device layer 120.

The extension 410 may extend through the first semiconductor chip 100. For example, a bottom surface 410B S of the extension 410 may be coplanar with the bottom surface of the first semiconductor chip 100. The bottom surface 410B S of the extension 410 may be coplanar with the bottom surface of the first semiconductor device layer 120. The bottom surface 410BS of the extension 410 may contact a portion of the first underfill 150 disposed under the first semiconductor chip 100. The bottom surface 410BS of the extension 410 may be covered with the first underfill 150.

A width W410 of the extension 410 in a first direction X parallel to the bottom surface (or the top surface) of the first semiconductor chip 100 may be the same as a width W130 of the through-via 130 in the first direction X. A height of the extension 410 in the vertical direction may be greater than a height of the through-via 130 in the vertical direction. For example, the extension 410 may extend through both the first semiconductor substrate 110 and the first semiconductor device layer 120 in the vertical direction. The through-via 130 may extend only through the first semiconductor substrate 110 in the vertical direction. However, an embodiment is not limited thereto. For example, the height of the extension 410 and the height of the through-via 130 in the vertical direction may be equal to each other.

The filler structure 400 (e.g., extension 410) may not be electrically connected to the through-via 130 and the first wiring structure 140 in the first semiconductor chip 100. For example, the filler structure 400 (e.g., extension 410) may not contact the through-via 130 and the first wiring structure 140. In some embodiments, the filler structure 400 (e.g., extension 410) may not vertically overlap the through-via 130 and the first wiring structure 140. In a plan view, the filler structure 400 (e.g., extension 410) may not overlap the through-via 130 and the first wiring structure 140. In a plan view, the filler structure 400 (e.g., extension 410) may not vertically overlap the first connection bump 170.

The extension 410 may be disposed on the first underfill 150. The first lower connection pad 142 may not vertically overlap the extension 410.

In a cross-sectional view, the extension 410 may be disposed in an edge area of the first semiconductor chip 100. For example, the extension 410 may be positioned outwardly of the through-via 130 and the first wiring structure 140 in the first semiconductor chip 100.

The width W410 of the extension 410 may be smaller than that of the contact portion 420 in the first direction X. However, an embodiment is not limited thereto. In another example, the width W410 of the extension 410 may be the same as that of the contact portion 420 in the first direction X.

The contact portion 420 may be disposed on a top surface of the extension 410. The contact portion 420 may be disposed below the column portion 310 of the heat spreader 300. The contact portion 420 may contact the column portion 310 of the heat spreader 300. A top surface 420US of the contact portion 420 may contact a bottom surface of the column portion 310 of the heat spreader 300.

The contact portion 420 may be, at least, partially disposed in the upper passivation film 112. For example, the top surface 420US of the contact portion 420 may be coplanar with a top surface 112US of the upper passivation film 112. A bottom surface of the contact portion 420 may be coplanar with a bottom surface of the upper passivation film 112.

The contact portion 420 may be positioned at the same level as that of the first upper connection pad 160 in the vertical direction. For example, the contact portion 420 and the first upper connection pad 160 may be formed in the same process. The top surface 420US of the contact portion 420 may be coplanar with a top surface of the first upper connection pad 160. The bottom surface of the contact portion 420 may be coplanar with a bottom surface of the first upper connection pad 160.

The width of the contact portion 420 in the first direction X may be greater than that of the extension 410 in the first direction X (e.g., W410). The width of the contact portion 420 in the first direction X may be the same as a width W310 of the column portion 310 of the heat spreader 300 in the first direction X. However, an embodiment is not limited thereto. In another example, the width of the contact portion 420 in the first direction X may be smaller than the width W310 of the column portion 310 of the heat spreader 300 in the first direction X. In still another example, the width of the contact portion 420 in the first direction X may be greater than the width W310 of the column portion 310 of the heat spreader 300 in the first direction X.

Since the extension 410 extends in the first semiconductor chip 100, the filler structure 400 may dissipate not only heat radiated from an outer surface (e.g., top surface) of the first semiconductor chip 100, but also heat generated within the first semiconductor chip 100.

The heat spreader 300 may be disposed on the first semiconductor chip 100. In cross-sectional view, the heat spreader 300 may extend around (e.g., surround) at least a portion of the second semiconductor chip 200. The heat spreader 300 may include a relatively high thermal conductivity material. For example, the heat spreader 300 may include Cu—W, Cu—Mo, CMC (Cu/Mo/Cu), CPC (Cu/MoCu/Cu), SCMC, WCu, CuC, or etc.

The heat spreader 300 may include the column portion 310, the roof portion 320, and a protrusion 330.

The column portion 310 may be disposed on the filler structure 400. The column portion 310 may be connected to the filler structure 400. The column portion 310 may contact the contact portion 420 of the filler structure 400. The column portion 310 may vertically overlap the contact portion 420 of the filler structure 400.

The column portion 310 may be spaced apart from the second semiconductor chip 200. An inner side surface of the column portion 310 may be spaced apart from a side surface of the second semiconductor chip 200. The column portion 310 may be disposed adjacent to each of both opposing sides of the second semiconductor chip 200. The column portion 310 may be disposed under the roof portion 320.

An outer side surface of the column portion 310 may be aligned with an outer side surface of the first semiconductor chip 100 in the vertical direction. However, an embodiment is not limited thereto. In another example, the outer side surface of the column portion 310 may be closer to the second semiconductor chip 200 than the outer side surface of the first semiconductor chip 100. In still another example, the outer side surface of the column portion 310 may be positioned outwardly of the outer side surface of the first semiconductor chip 100.

In a plan view, a shape of the column portion 310 may be, for example, a rectangular shape. In another example, in a plan view, the shape of the column portion 310 may be circular. In still another example, in a plan view, the shape of the column portion 310 may have a shape other than the rectangular shape and the circular shape.

A height H310 of the column portion 310 in the vertical direction may be 70 micrometers (μm) or larger. The height H310 of the column portion 310 may refer to a distance in the vertical direction from a bottom surface of the column portion 310 that contacts the top surface 420US of the contact portion 420 to a top surface of the column portion 310 that is coplanar with the top surface 200US of the second semiconductor chip 200. A width W310 of the column portion 310 in the first direction X may be greater than or equal to 20 μm. The width W310 of the column portion 310 may refer to a diameter of the column portion 310.

The roof portion 320 may be disposed on the second semiconductor chip 200 and the column portion 310. In a plan view, the roof portion 320 may extend across the second semiconductor chip 200. The roof portion 320 may contact the second semiconductor chip 200. For example, a bottom surface of the roof portion 320 may face (e.g., directly contact) a top surface 200US of the second semiconductor chip 200. The roof portion 320 may cover a portion of the top surface 200US of the second semiconductor chip 200. The roof portion 320 may overlap a portion of the second semiconductor chip 200.

The roof portion 320 may be disposed on the mold layer 290. For example, the roof portion 320 may contact a top surface of the mold layer 290. The mold layer 290 disposed below the roof portion 320 extending across the second semiconductor chip 200 may fill a space defined by the second semiconductor chip 200, the roof portion 320, and the column portion 310.

The roof portion 320 may be connected to the column portion 310. The column portion 310 may extend in the vertical direction from each of both opposing ends of the roof portion 320 toward the first semiconductor chip 100. The roof portion 320 may overlap the column portion 310. In some embodiments, the column portion 310 and the roof portion 320 may be connected to form a unitary structure.

A thickness TH320 of the roof portion 320 in the vertical direction may be 10 μm or larger. The thickness TH320 of the roof portion 320 may refer to a distance in the vertical direction from a bottom surface of the roof portion 320 to a top surface of a portion of the roof portion 320 on which the protrusion 330 is not disposed. The bottom surface of the roof portion 320 may contact the top surface 200US of the second semiconductor chip 200. The bottom surface of the roof portion 320 may be coplanar with the top surface 200US of the second semiconductor chip 200.

The protrusion 330 may be disposed on the roof portion 320. The protrusion 330 may protrude upwardly from the roof portion 320. In some embodiments, the protrusion 330 and the roof portion 320 may be connected to form a unitary structure. The protrusion 330 may extend in a second direction Y parallel the bottom surface (or top surface) of the first semiconductor chip 100. The first direction X and the second direction Y may intersect each other. The protrusion 330 may extend in the second direction Y intersecting the first direction X in which the roof portion 320 extends. However, an embodiment is not limited thereto. For example, a plurality of protrusions 330 may extend in the first direction X in which the roof portion 320 extends and may be spaced apart from each other in the second direction Y.

The protrusions 330 may be repeatedly arranged and may be spaced apart from each other in the first direction X. The plurality of protrusions 330 may be spaced apart from each other by a regular spacing. In some embodiments, the plurality of protrusions 330 may be spaced apart from each other by non-regular spacings.

In FIG. 2 and FIG. 3, the protrusion 330 is illustrated as having a rectangular cross-sectional shape. However, an embodiment is not limited thereto. In another example, the protrusion 330 may have a circularly-convex cross-sectional shape.

A height H330 of the protrusion 330 may be 5 μm or larger. The height H330 of the protrusion 330 may refer to a distance in the vertical direction from a same vertical level as that of the top surface of a portion of the roof portion 320 on which the protrusion 330 is not disposed to a top surface of the protrusion 330. A width W330 of the protrusion 330 may be 5 μm or larger.

The heat spreader 300 including the protrusion 330 disposed on the roof portion 320 may have an increased surface area. Accordingly, performance of the heat spreader 300 dissipating the heat through the surface thereof may be improved.

Figure 4:
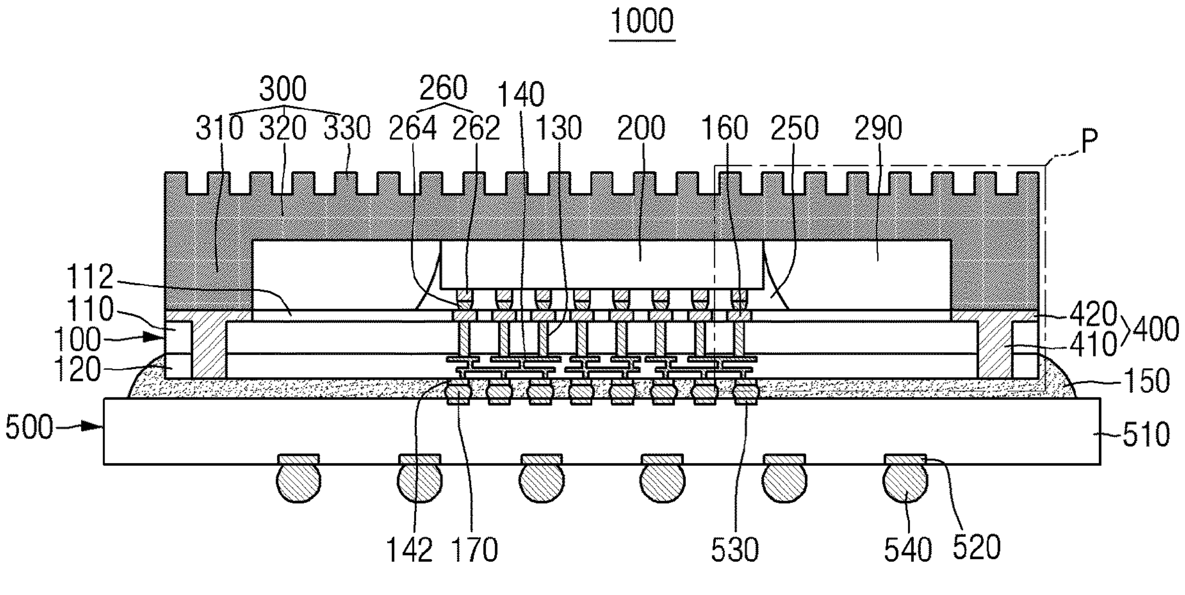
FIG. 4 is a cross-sectional view for illustrating a semiconductor package according to some embodiments.
Figure 5:
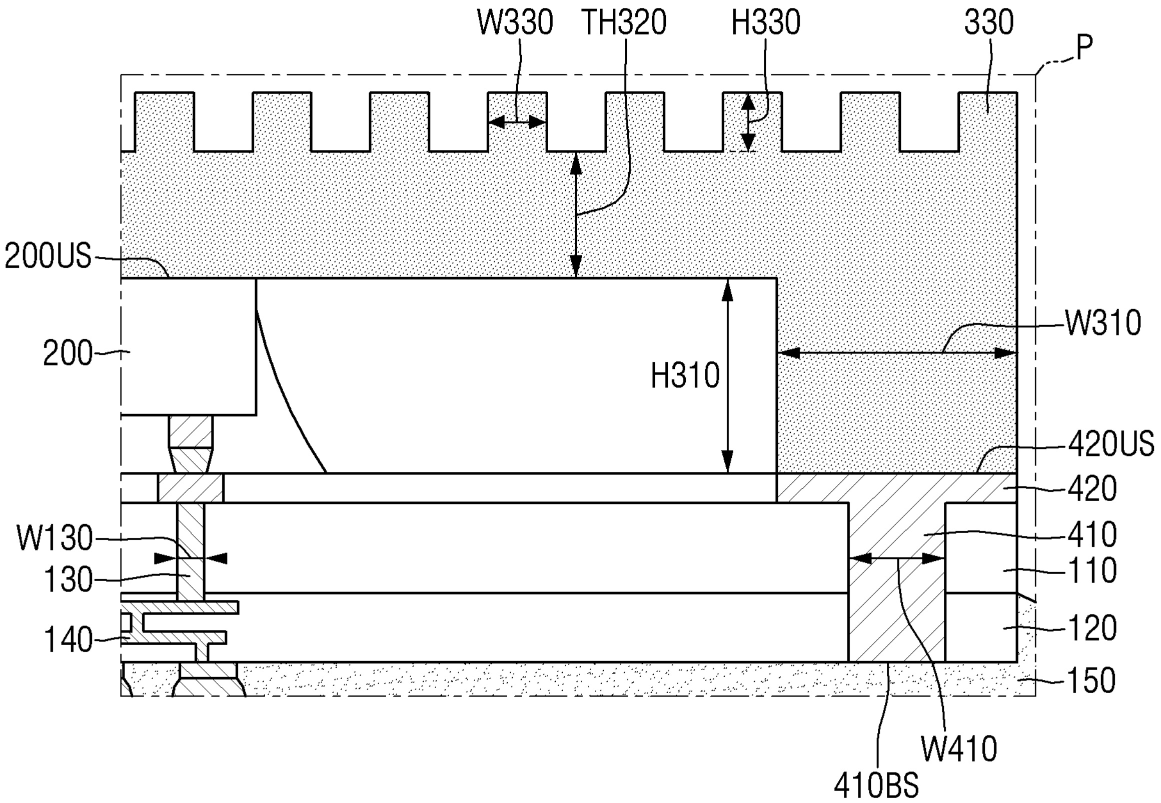
FIG. 5 is an enlarged view showing a P portion of FIG. 4.

FIG. 4 is a cross-sectional view for illustrating a semiconductor package according to some embodiments. FIG. 5 is an enlarged view showing a P portion of FIG. 4. For convenience of description, following description is based on differences thereof from the descriptions as set forth above with referring to FIG. 1 to FIG. 3.

Referring to FIG. 4 and FIG. 5, the width W410 of the extension 410 of the filler structure 400 in the first direction X and the width W130 of the through-via 130 in the first direction X may be different from each other. For example, the width W410 of the extension 410 may be greater than the width W130 of the through-via 130.

Figure 6:
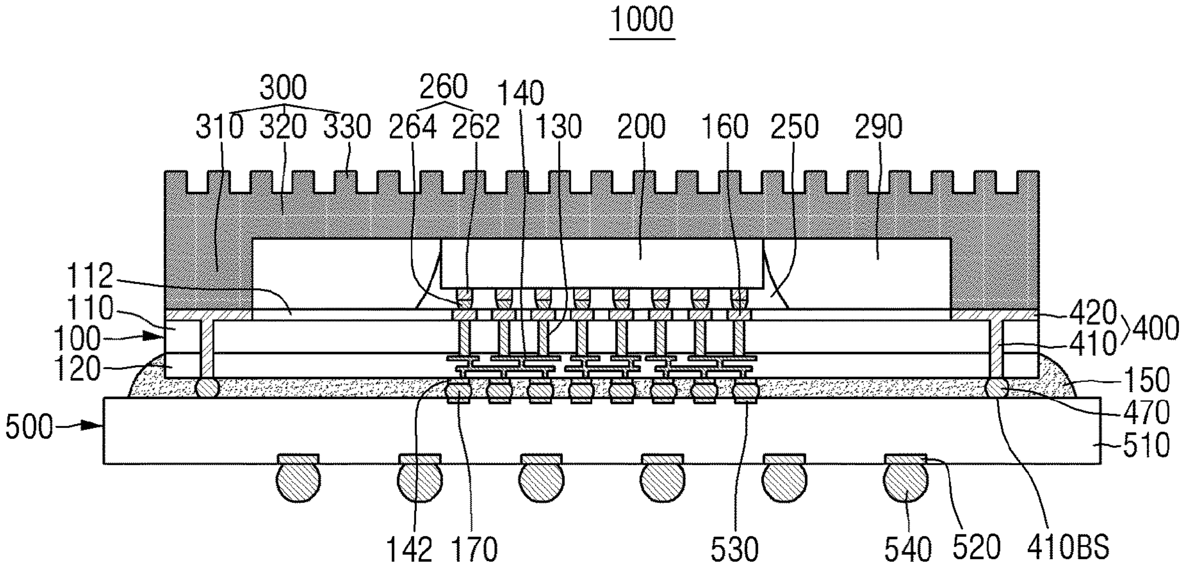
FIG. 6 is a cross-sectional view for illustrating a semiconductor package according to some embodiments.

FIG. 6 is a cross-sectional view for illustrating a semiconductor package according to some embodiments. For convenience of description, following description is based on differences thereof from the descriptions as set forth above with reference to FIG. 2.

Referring to FIG. 6, the semiconductor package according to some embodiments may further include a dummy bump 470. The dummy bump 470 may be disposed under the filler structure 400. The dummy bump 470 may be connected to the filler structure 400. For example, the dummy bump 470 may contact the extension 410 of the filler structure 400.

The dummy bump 470 may be disposed on the base substrate 500. The dummy bump 470 may contact the top surface of the substrate body 510. For example, the dummy bump 470 may be disposed between the filler structure 400 and the substrate body 510. The dummy bump 470 may not come into contact with a wiring included in the base substrate 500.

The dummy bump 470 may not be electrically connected to the base substrate 500. For example, the dummy bump 470 may not be electrically connected to a wiring pattern disposed within the substrate body 510. In some embodiments, the dummy bump 470 may not be electrically connected to the bottom pad 520 and the top pad 530.

The dummy bump 470 may be disposed within the first underfill 150. The dummy bump 470 may be, at least partially, surrounded with the first underfill 150.

The dummy bump 470 may include a relatively high thermal conductivity material. The dummy bump 470 may transfer heat generated from the base substrate 500. For example, the dummy bump 470 may transfer heat radiated from the top surface of the substrate body 510 to the filler structure 400.

Figure 7:
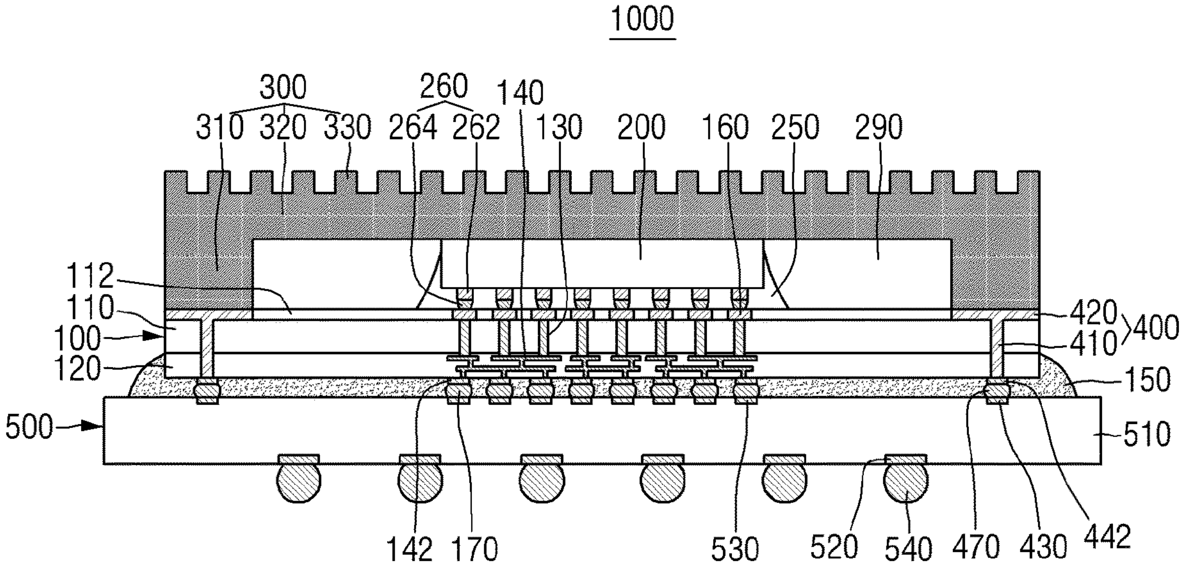
FIG. 7 is a cross-sectional view for illustrating a semiconductor package according to some embodiments.

FIG. 7 is a cross-sectional view for illustrating a semiconductor package according to some embodiments. For convenience of description, following description is based on differences thereof from the descriptions as set forth above with reference to FIG. 2.

Referring to FIG. 7, the semiconductor package according to some embodiments may include a dummy upper connection pad 442, the dummy bump 470, and a dummy lower connection pad 430.

The dummy upper connection pad 442 may be disposed under the filler structure 400. The dummy upper connection pad 442 may contact the extension 410 of the filler structure 400. The extension 410 may overlap the dummy upper connection pad 442 in the vertical direction.

The dummy bump 470 may be disposed between the dummy upper connection pad 442 and the dummy lower connection pad 430. The dummy bump 470 may be disposed below the dummy upper connection pad 442. The dummy bump 470 may be disposed on the dummy lower connection pad 430.

The dummy upper connection pad 442 and the dummy bump 470 may be disposed within the first underfill 150. The dummy upper connection pad 442 and the dummy bump 470 may be, at least partially, surrounded with the first underfill 150.

The dummy lower connection pad 430 may be disposed on the top surface of the substrate body 510. The dummy lower connection pad 430 may not be electrically connected to the bottom pad 520. The dummy lower connection pad 430 may not be electrically connected to the wiring pattern disposed within the substrate body 510. In some embodiments, the dummy lower connection pad 430 may not be connected to the bottom pad 520 and the top pad 530.

The dummy lower connection pad 430 may include a relatively high thermal conductivity material. For example, the dummy lower connection pad 430 may transfer heat generated in the substrate body 510 to the dummy bump 470 and the dummy upper connection pad 442.

The dummy lower connection pad 430 disposed on the top surface of the substrate body 510 may dissipate not only the heat radiated from the surface of the base substrate 500 but also the heat generated within the base substrate 500.

Figure 8:
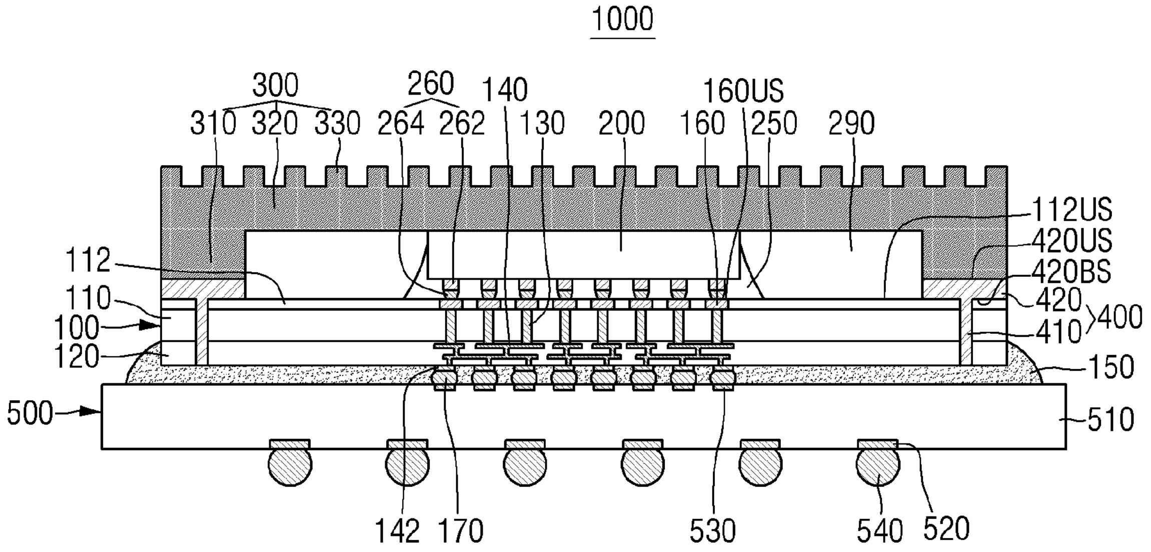
FIG. 8 is a cross-sectional view for illustrating a semiconductor package according to some embodiments.

FIG. 8 is a cross-sectional view for illustrating a semiconductor package according to some embodiments. For convenience of description, following description is based on differences thereof from the descriptions as set forth above with reference to FIG. 2.

Referring to FIG. 8, the contact portion 420 of the filler structure 400 may be disposed on the first semiconductor chip 100. In some embodiments, the contact portion 420 may be disposed on the upper passivation film 112.

The top surface 420US of the contact portion 420 may be positioned at a vertical level higher than that of a top surface 112US of the upper passivation film 112. The top surface 420US of the contact portion 420 may be positioned at a vertical level higher than that of a top surface 160US of the first upper connection pad 160.

A bottom surface 420BS of the contact portion 420 may be coplanar with the top surface 112US of the upper passivation film 112. The bottom surface 420BS of the contact portion 420 may be positioned at a vertical level higher than that of a bottom surface of the upper passivation film 112.

The extension 410 may extend in the vertical direction through the upper passivation film 112. A portion of a side surface of the extension 410 may be surrounded with the upper passivation film 112.

In FIG. 8, it is illustrated that the bottom surface 420BS of the contact portion 420 is coplanar with the top surface 112US of the upper passivation film 112. However, an embodiment is not limited thereto. For example, the bottom surface 420BS of the contact portion 420 may be positioned at a vertical level lower than that of the top surface 112US of the upper passivation film 112 and may be positioned at a vertical level higher than that of the bottom surface of the upper passivation film 112. That is, the bottom surface 420BS of the contact portion 420 may be disposed between the top surface 112US of the upper passivation film 112 and the bottom surface of the upper passivation film 112. In another example, the bottom surface 420BS of the contact portion 420 may be positioned at a vertical level higher than that of the top surface 112US of the upper passivation film 112.

Figure 9:
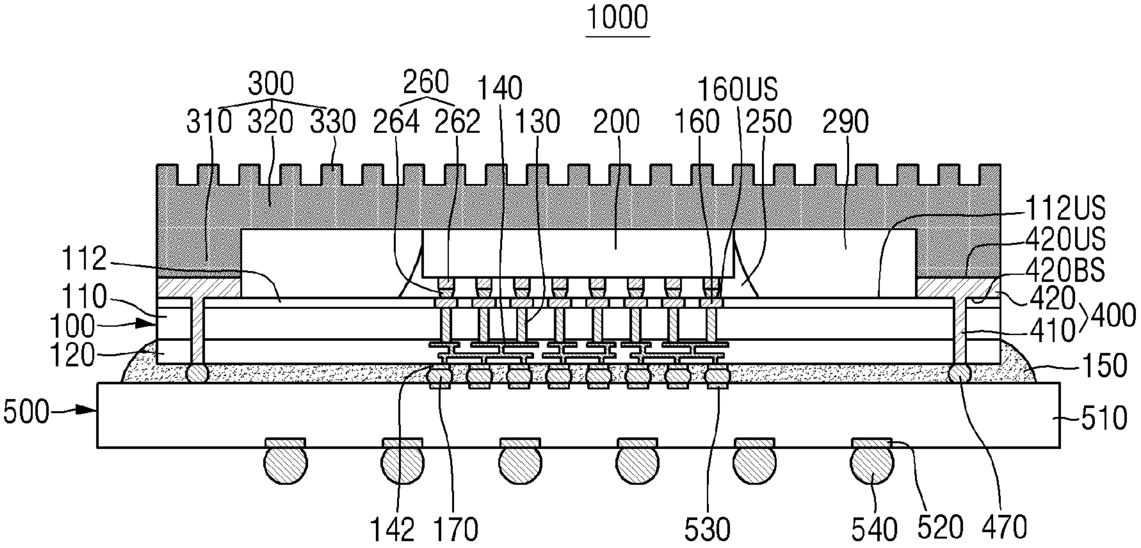
FIG. 9 is a cross-sectional view for illustrating a semiconductor package according to some embodiments.

FIG. 9 is a cross-sectional view for illustrating a semiconductor package according to some embodiments. For convenience of description, following description is based on differences thereof from the descriptions as set forth above with reference to FIG. 8.

Referring to FIG. 9, the semiconductor package according to some embodiments may include the dummy bump 470. The dummy bump 470 may be disposed between the substrate body 510 and the extension 410 of the filler structure 400.

The extension 410 may extend in the vertical direction from a top surface of the dummy bump 470 to a same vertical level of the top surface 112US of the upper passivation film 112. The dummy bump 470 may transfer heat radiated from the top surface of the substrate body 510 to the filler structure 400.

FIG. 9 illustrates that only the dummy bump 470 is disposed under the extension 410. However, an embodiment is not limited thereto. For example, the dummy upper connection pad 442, referring to FIG. 7, may be disposed under the extension 410. Further, the dummy lower connection pad 430, referring to FIG. 7, may be disposed under the dummy bump 470.

FIG. 10 to FIG. 13 are plan views for illustrating semiconductor packages according to some embodiments, respectively. For convenience of description, following description is based on differences thereof from the descriptions as set forth above with reference to FIG. 1.

Figure 10:
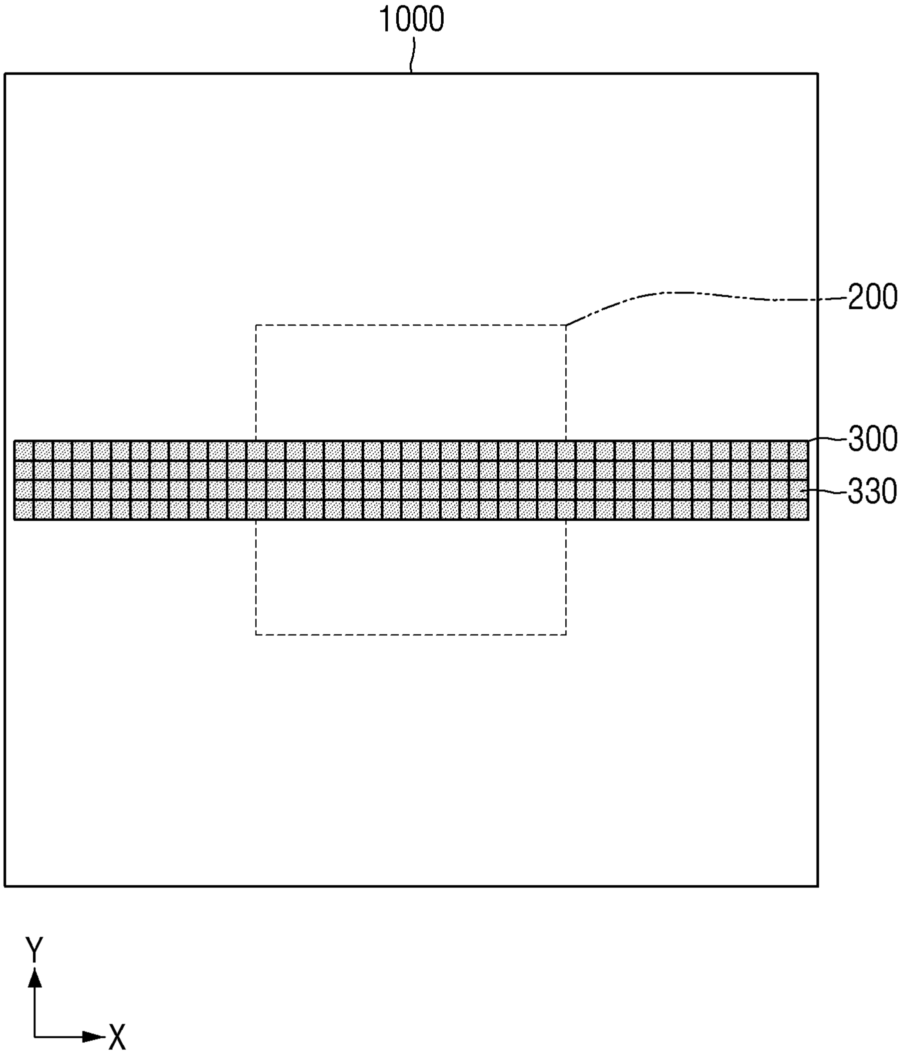
FIG. 10 to FIG. 13 are plan views for illustrating semiconductor packages according to some embodiments, respectively.

Referring to FIG. 10, the protrusions 330 of the heat spreader 300 may be arranged in a grid pattern. In a plan view, each of the heat spreader 300 may have similar or same lengths in the first direction X and the second direction Y and may be arranged in a grid pattern.

Figure 11:
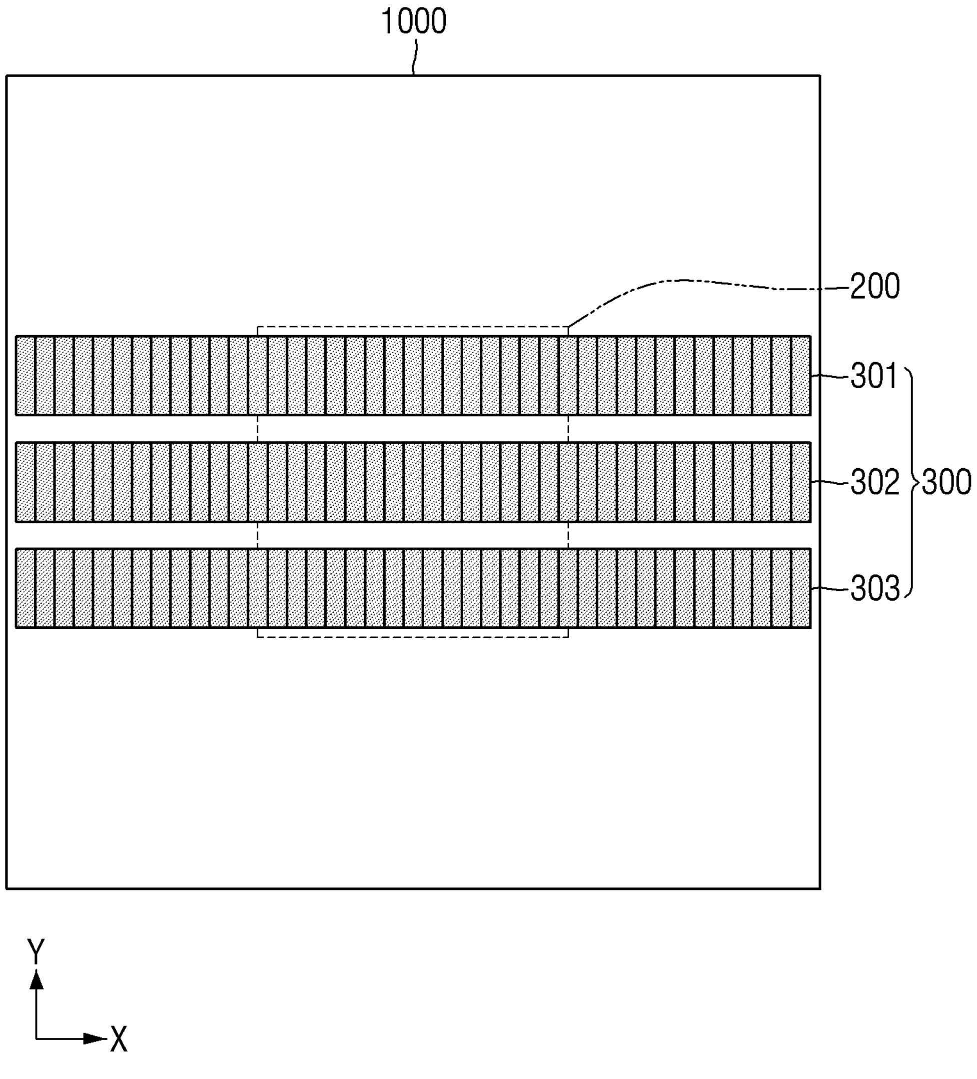

Referring to FIG. 11, a plurality of sub-components of the heat spreader 300 may be arranged. For example, the heat spreader 300 may include a first sub-heat spreader to a third sub-heat spreader 301 to 303. However, the number of sub-heat spreader is not limited thereto.

Each of the first sub-heat spreader to the third sub-heat spreader 301 to 303 may extend in the first direction X. For example, the roof portion 320, referring to FIG. 2, of each of the first sub-heat spreader to the third sub-heat spreader 301 to 303 may extend in the first direction X. Each of the first sub-heat spreader to the third sub-heat spreader 301 to 303 may extend across the second semiconductor chip 200.

The first sub-heat spreader to the third sub-heat spreader 301 to 303 may be spaced apart from each other in the second direction Y. Each of the first sub-heat spreader to the third sub-heat spreader 301 to 303 may overlap the second semiconductor chip 200.

The protrusions 330, referring to FIG. 2, of each of the first sub-heat spreader to the third sub-heat spreader 301 to 303 may extend in the second direction Y and may be spaced apart from each other in the first direction X. However, the embodiment is not limited thereto.

Figure 12:
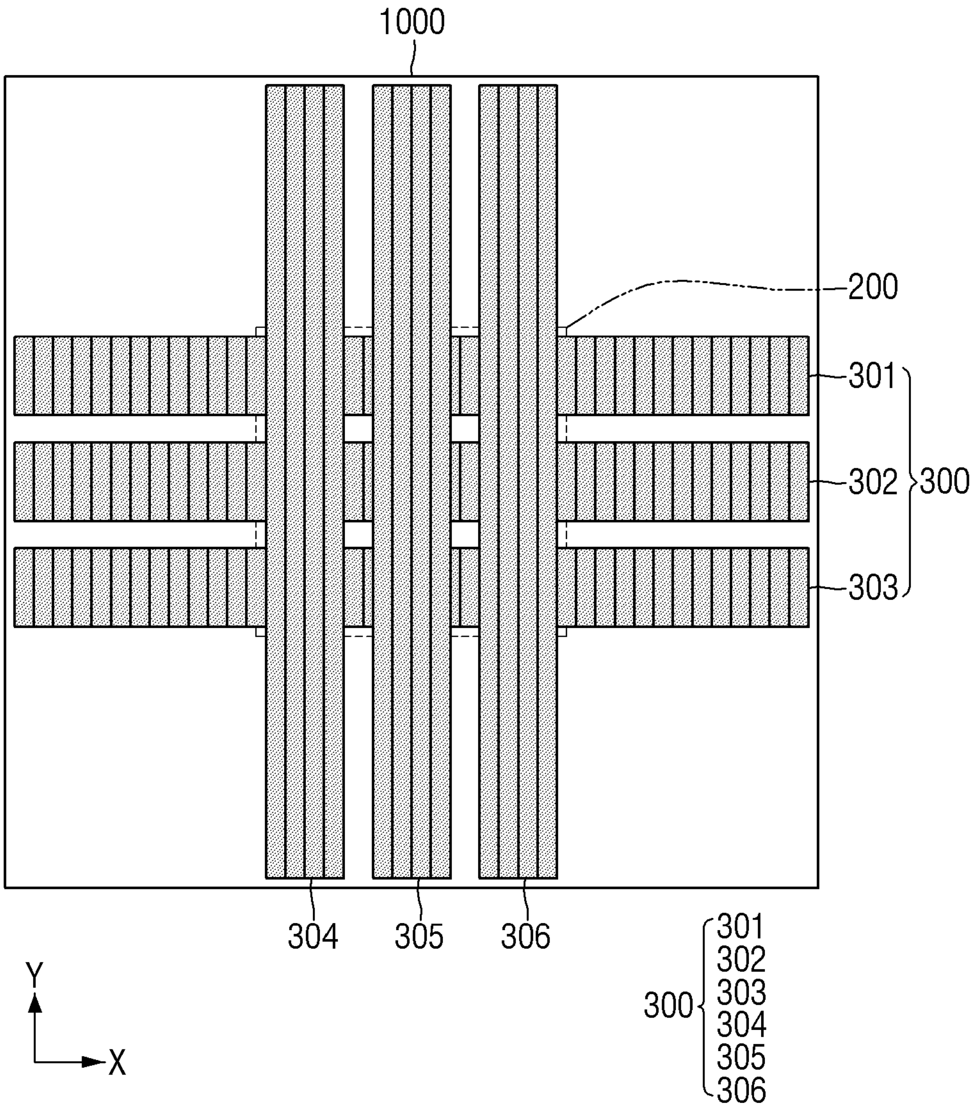

Referring to FIG. 12, a plurality of sub-components of the heat spreaders 300 may intersect each other. For example, the heat spreader 300 may include a first sub-heat spreader to a sixth sub-heat spreader 301 to 306. However, the number of sub-heat spreader is not limited thereto. The first sub-heat spreader to the third sub-heat spreader 301 to 303 may extend in the first direction X and be spaced apart from each other in the second direction Y. The fourth sub-heat spreader to the sixth sub-heat spreader 304 to 306 may extend in the second direction Y and be spaced apart from each other in the first direction X. The embodiments of the first sub-heat spreader to the sixth sub-heat spreader 301 to 306 are not limited thereto.

The first sub-heat spreader to the third sub-heat spreader 301 to 303 and the fourth sub-heat spreader to sixth sub-heat spreader 304-306 may intersect each other. The first sub-heat spreader to the third sub-heat spreader 301 to 303 and the fourth sub-heat spreader to sixth sub-heat spreader 304-306 may be disposed at the same vertical level in a cross-sectional view.

Figure 13:
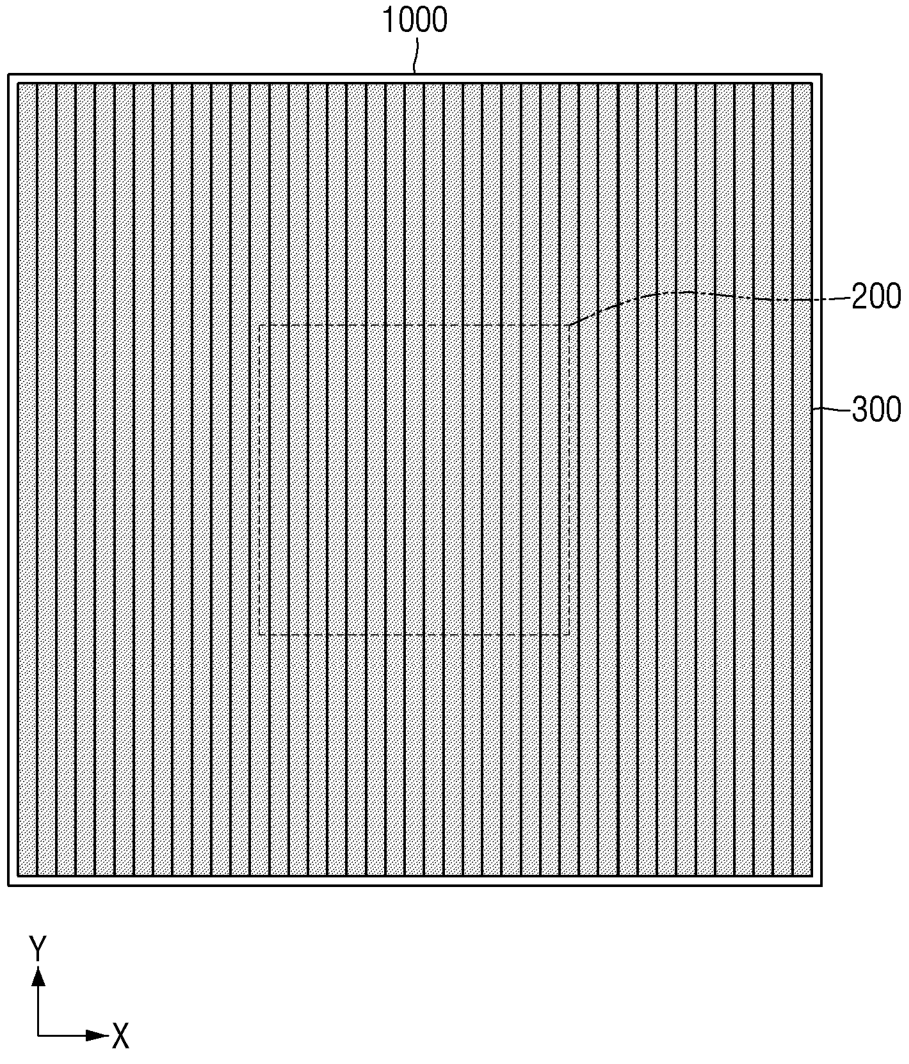

Referring to FIG. 13, the heat spreader 300 may cover an entirety of the top surface 200US of the second semiconductor chip 200. The heat spreader 300 may overlap an entirety of the top surface 200US of the second semiconductor chip 200. The roof portion 320 of the heat spreader 300, referring to FIG. 2, may cover an entirety of the top surface 200US of the second semiconductor chip 200. The roof portion 320 of the heat spreader 300 may contact the entirety of the top surface 200US of the second semiconductor chip 200.

For example, the column portion 310 of the heat spreader 300, referring to FIG. 2, may have a rectangular ring shape extending around (e.g., surrounding) the entirety of the top surface 200US of the second semiconductor chip 200 in a plan view. In some embodiments, a plurality of column portions 310 of the heat spreader 300 may be spaced apart from each other. In this case, the second semiconductor chip 200 may be disposed between adjacent ones of the plurality of column portions 310 spaced apart from each other.

Figure 14:
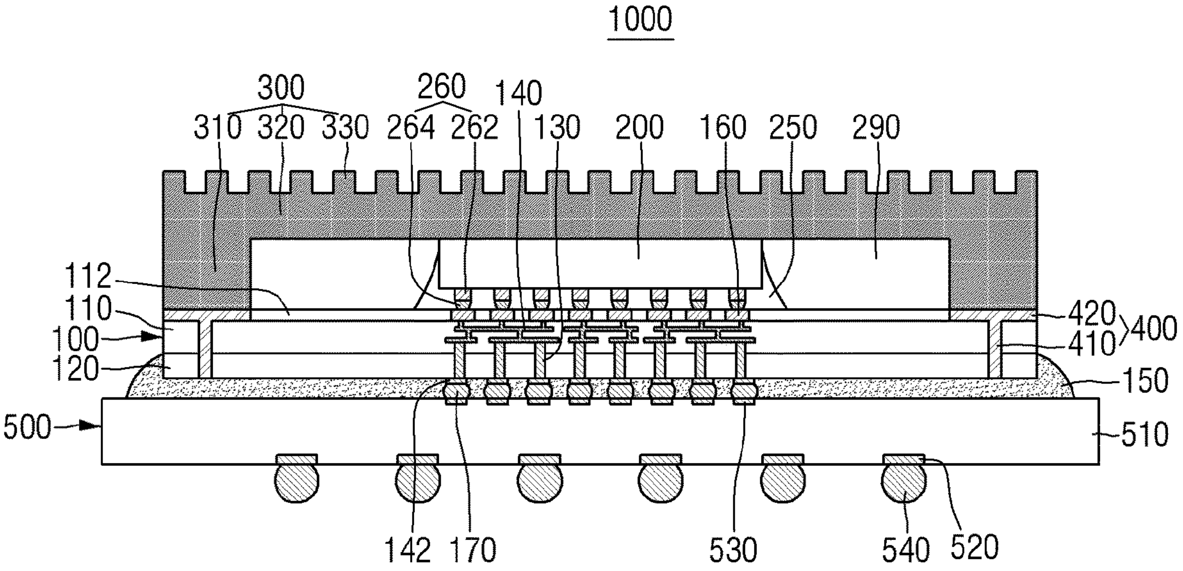
FIG. 14 is a cross-sectional view for illustrating a semiconductor package according to some embodiments.

FIG. 14 is a cross-sectional view for illustrating a semiconductor package according to some embodiments. For convenience of description, following description is based on differences thereof from the descriptions as set forth above with reference to FIG. 2.

Referring to FIG. 14, the through-via 130 of the first semiconductor chip 100 may be disposed under the first wiring structure 140. The first wiring structure 140 may face the second semiconductor chip 200. The through-via 130 may face the package substrate 500.

The through-via 130 may be disposed on the first lower connection pad 142. The through-via 130 may be connected to the first lower connection pad 142. The first wiring structure 140 may be disposed on the through-via 130. The through-via 103 may be disposed between the first wiring structured 140 and the first lower connection pad 142 in the vertical direction.

The first wiring structure 140 may be disposed below the first upper connection pad 160. The first wiring structure 140 may be connected to the first upper connection pad 160. The first wiring structure 140 may be disposed between the first upper connection pad 160 and the through-via 130 in the vertical direction.

FIG. 15 to FIG. 25 are cross-sectional views of intermediate structures corresponding to intermediate steps for illustrating a method for manufacturing a semiconductor package according to some embodiments. For reference, FIG. 15 to FIG. 25 are diagrams for illustrating a method for manufacturing the semiconductor package as shown in FIG. 2. For convenience of description, following description is based on differences thereof from the descriptions as set forth above with reference to FIG. 1 to FIG. 3.

Figure 15:
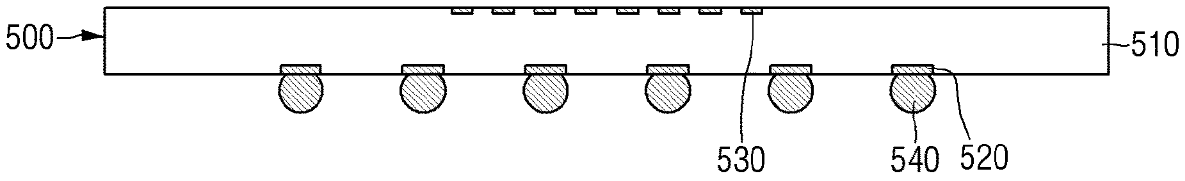
FIG. 15 to FIG. 25 are cross-sectional views of intermediate structures corresponding to intermediate steps for illustrating a method for manufacturing a semiconductor package according to some embodiments.

Referring to FIG. 15, the package substrate 500 may be formed. For example, the package substrate 500 including the substrate body 510, and the bottom pad 520, the top pad 530 formed in the substrate body 510, and the external connection terminal 40 formed on the substrate body 510 may be formed.

Figure 16:
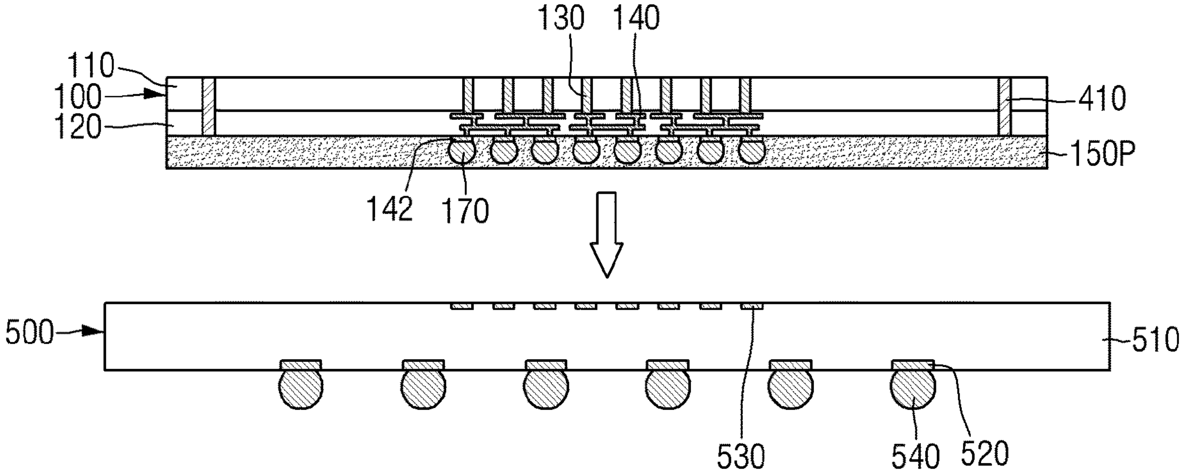

Referring to FIG. 16, the first semiconductor chip 100, including the first semiconductor substrate 110 and the first semiconductor device layer 120, may be stacked on the package substrate 500.

The through-via 130 may be formed in the first semiconductor substrate 110. The first wiring structure 140 may be formed in the first semiconductor device layer 120. A first pre-underfill 150P may be disposed under or on a bottom surface of the first semiconductor chip 100.

The extension 410 may be formed to extend in the vertical direction through the first semiconductor substrate 110 and the first semiconductor device layer 120. For example, a trench may be formed to extend in the vertical direction through the first semiconductor substrate 110 and the first semiconductor device layer 120. The extension 410 may be formed in the trench formed to extend through the first semiconductor substrate 110 and the first semiconductor device layer 120.

For example, the extension 410 may include a material having relatively high thermal conductivity such as Cu—W, Cu—Mo, CMC (Cu/Mo/Cu), CPC (Cu/MoCu/Cu), SCMC, WCu, CuC, or etc.

Figure 17:
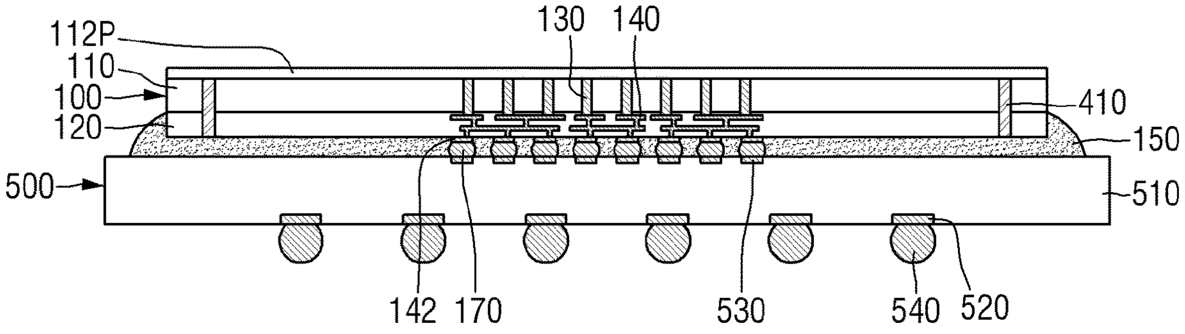

Referring to FIG. 17, a pre-upper passivation film 112P may be formed on the first semiconductor substrate 110.

The pre-upper passivation film 112P may overlap (e.g., cover) portions of the first semiconductor substrate 110, the through-via 130, and the extension 410.

Figure 18:
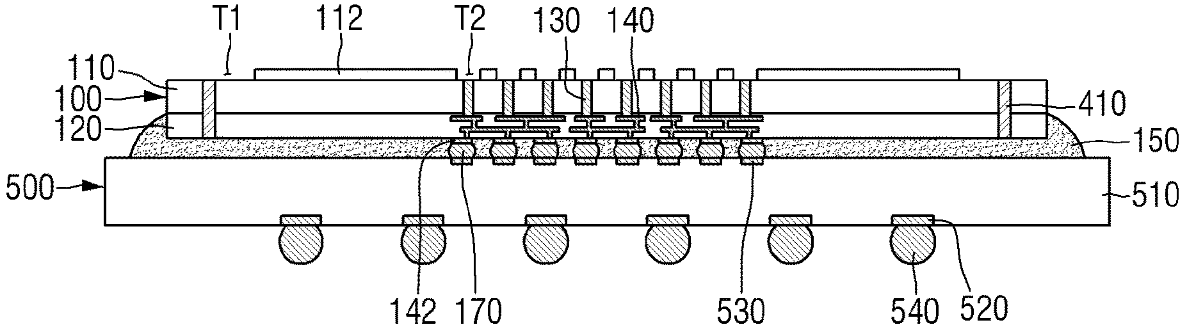

Referring to FIG. 18, a first trench T1 and a second trench T2 may be formed in the pre-upper passivation film 112P.

The first trench T1 may expose a portion (e.g., the top surface) of the extension 410. The second trench T2 may expose a portion (e.g., a portion of the top surface) of the first semiconductor substrate 110. The second trench T2 may expose a portion (e.g., the top surface) of the through-via 130. The first trench T1 and the second trench T2 may have different widths in the first direction X. For example, the width of the first trench T1 in the first direction X may be greater than the width of the second trench T2 in the first direction X.

Figure 19:
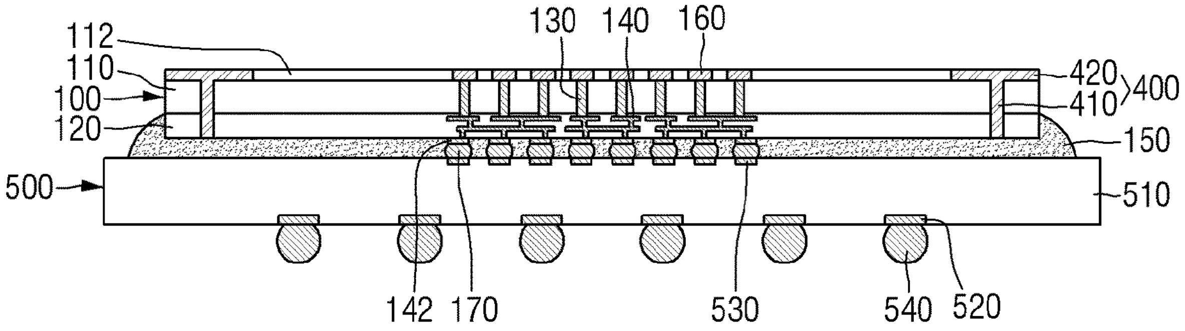

Referring to FIG. 19, the first upper connection pad 160 and the contact portion 420 may be formed in the upper passivation film 112.

For example, the contact portion 420 may be formed in the first trench T1. The first upper connection pad 160 may be formed in the second trench T2.

Figure 20:
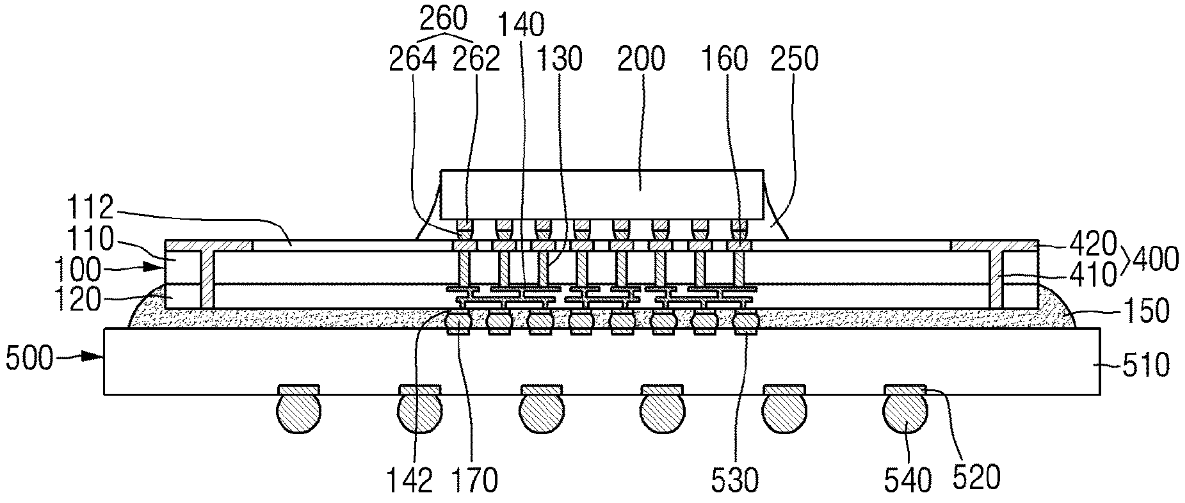

Referring to FIG. 20, the second semiconductor chip 200 may be formed.

The second semiconductor chip 200 may be stacked on the top surface of the first semiconductor chip 100. The second underfill 250 may fill a space between the second semiconductor chip 200 and the first semiconductor chip 100. The second semiconductor chip 200 may be connected to the first upper connection pad 160 of the first semiconductor chip 100 via the second connection bump 260.

Figure 21:
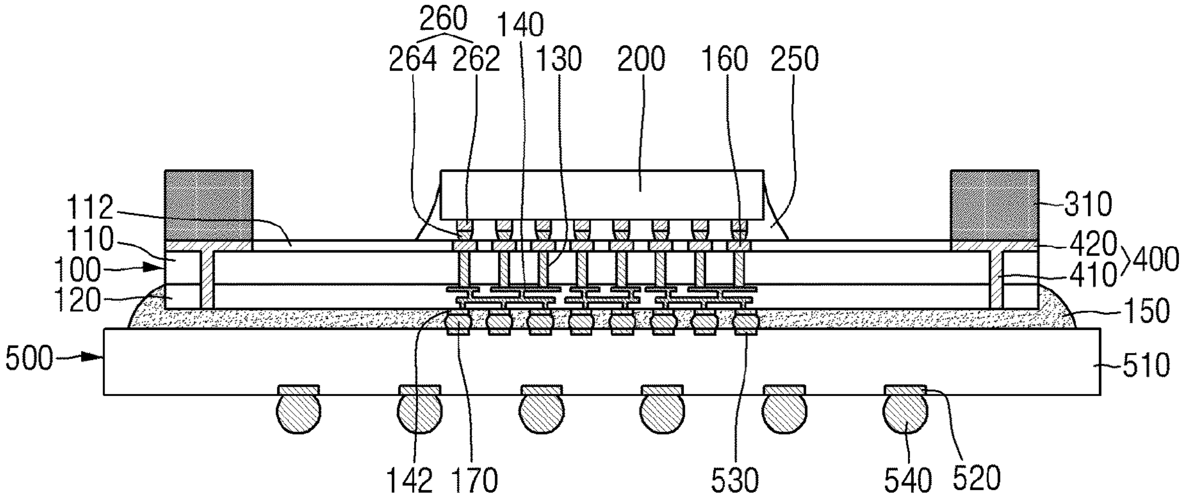

Referring to FIG. 21, the column portion 310 may be formed.

The column portion 310 may be formed on the contact portion 420. The column portion 310 may be formed so as to be spaced apart from the second semiconductor chip 200. The column portion 310 may be formed adjacent to each of both opposing sides of the second semiconductor chip 200.

Figure 22:
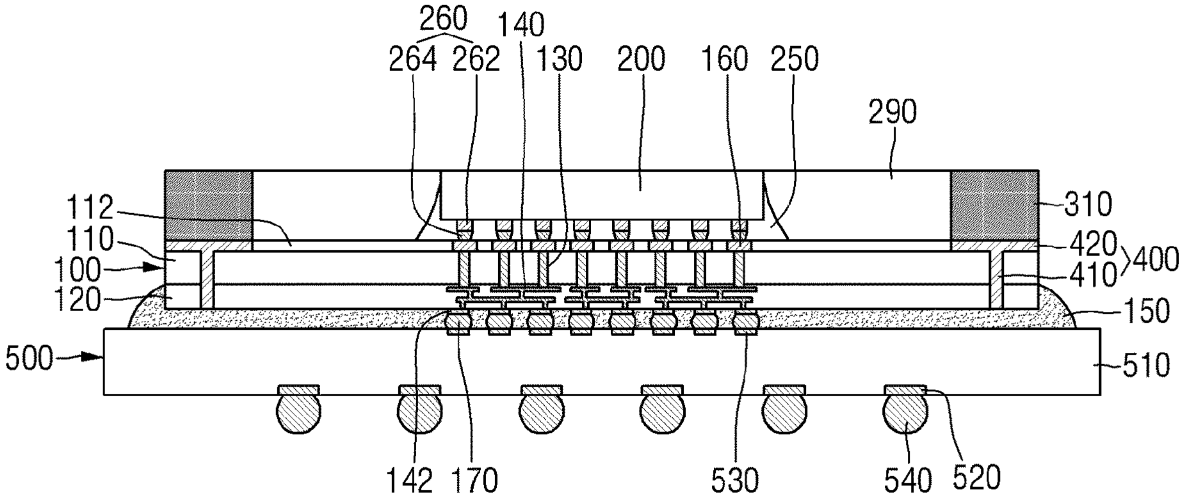

Referring to FIG. 22, the mold layer 290 may be formed.

The mold layer 290 may be formed to fill a space between the second semiconductor chip 200 and the column portion 310.

Figure 23:
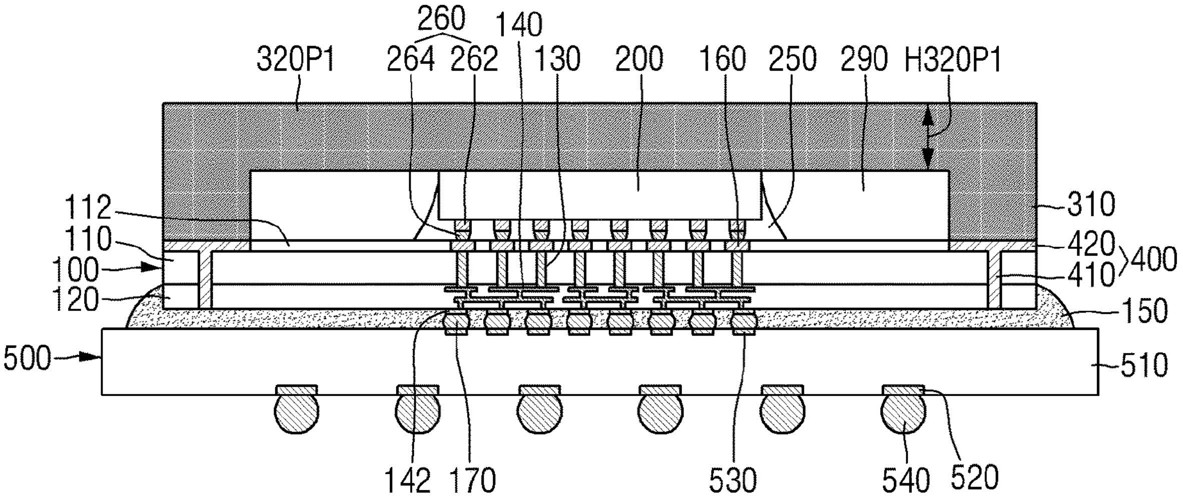

Referring to FIG. 23, a first pre-roof portion 320P1 may be formed. The first pre-roof portion 320P1 may be formed on the second semiconductor chip 200, the mold layer 290, and the column portion 310. The first pre-roof portion 320P1 may be connected to each of the column portions 310 spaced apart from each other. The first pre-roof portion 320P1 may contact the top surface of the second semiconductor chip 200.

The first pre-roof portion 320P1 may have a first height H320P1 in the vertical direction.

Figure 24:
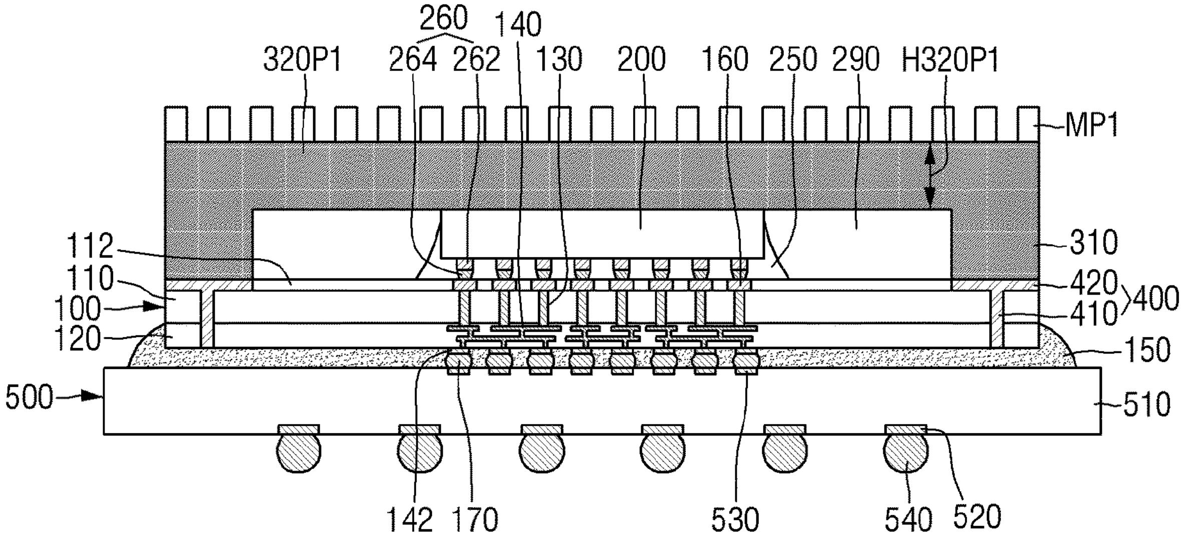
Figure 25:
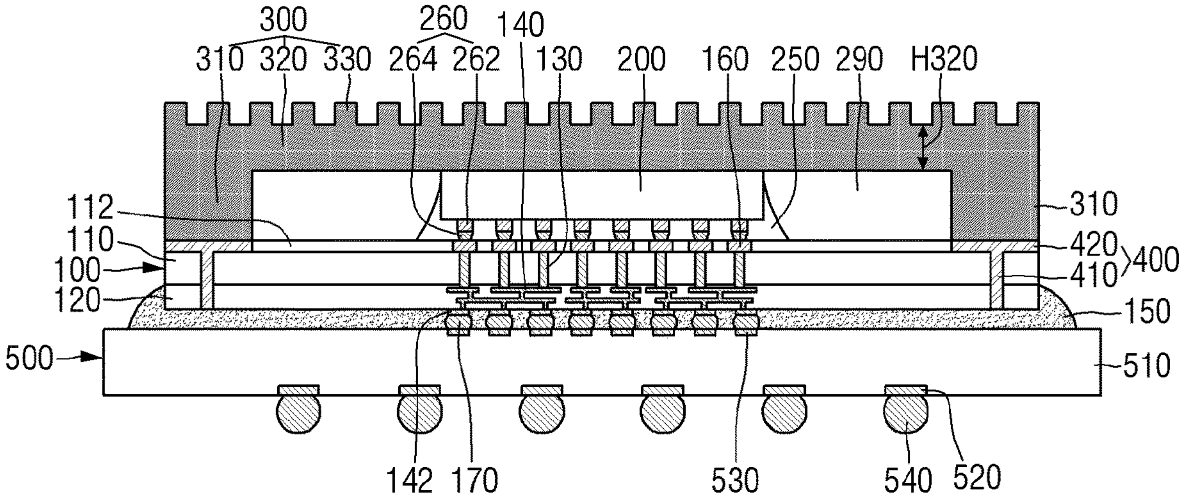

Referring to FIG. 24 and FIG. 25, a first mask pattern MP1 may be formed on the first pre-roof portion 320P1. Subsequently, the roof portion 320 and the protrusion 330 may be formed using the first mask pattern MP1.

For example, a portion of the first pre-roof portion 320P1 may be removed using the first mask pattern MP1. For example, a portion of the first pre-roof portion 320P1 not covered with the first mask pattern MP1 may be etched. The protrusion 330 may correspond to a portion of the first pre-roof portion 320P1 that is not etched. That is, the protrusion 330 may correspond to a portion of the first pre-roof portion 320P1 covered with the first mask pattern MP1.

A height H320 of the roof portion 320 may correspond to a thickness (in the vertical direction) of a portion of the first pre-roof portion 320P1 not covered with the first mask pattern MP1 and thus etched by an etchant. Accordingly, the height H320 of the roof portion 320 may be smaller than a first height H320P1 of the first pre-roof portion 320P1.

Figure 26:
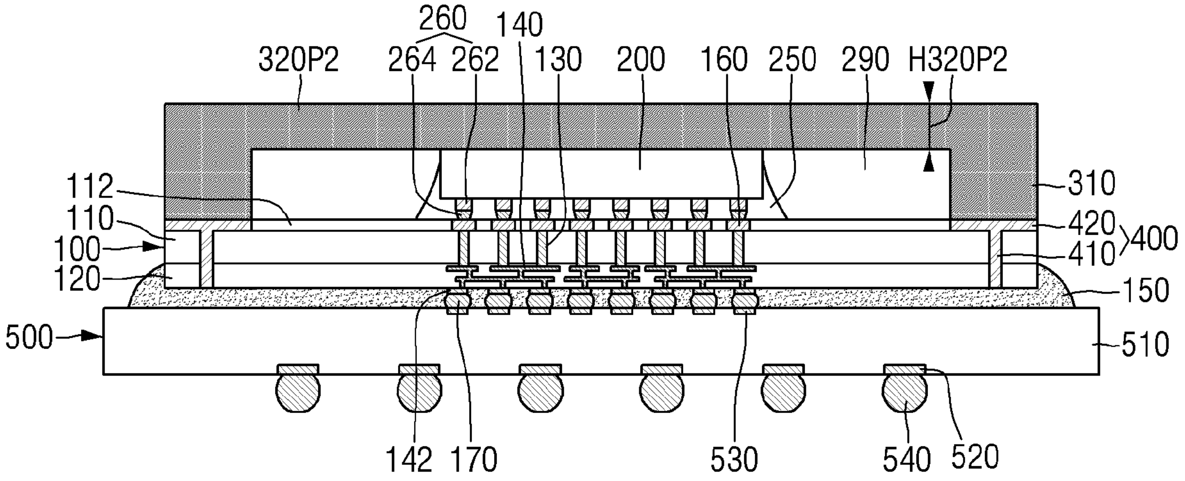
FIG. 26 to FIG. 29 are cross-sectional views of intermediate structures corresponding to intermediate steps for illustrating a method for manufacturing a semiconductor package according to some further embodiments.

FIG. 26 to FIG. 29 are cross-sectional views of intermediate structures corresponding to intermediate steps for illustrating a method for manufacturing a semiconductor package according to some further embodiments. For convenience of description, following description is based on differences thereof from the descriptions as set forth above with referring to FIG. 15 to FIG. 25. For reference, FIG. 26 shows a step after FIG. 22.

Referring to FIG. 22 and FIG. 26, a second pre-roof portion 320P2 may be formed.

The second pre-roof portion 320P2 may be formed on the second semiconductor chip 200, the mold layer 290, and the column portion 310. The second pre-roof portion 320P2 may have a second height H320P2 in the vertical direction.

Figure 27:
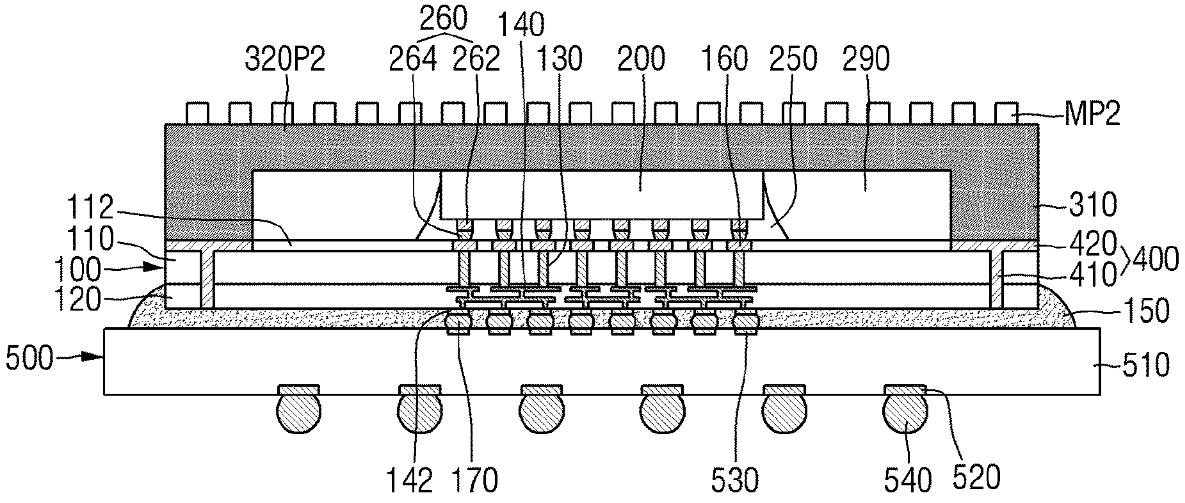

Referring to FIG. 27, a second mask pattern MP2 may be formed on the second pre-roof portion 320P2.

Figure 28:
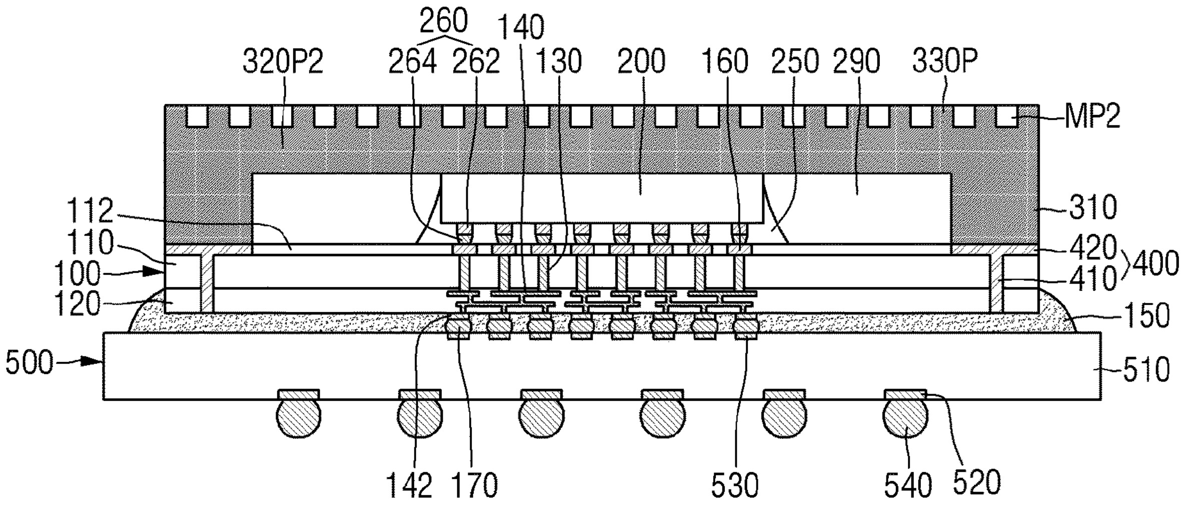

Referring to FIG. 28, a pre-protrusion 330P may be formed on the second pre-roof portion 320P2.

For example, the pre-protrusion 330P may be formed on a portion of the second pre-roof portion 320P2 not covered with the second mask pattern MP2. For example, the pre-protrusion 330P may fill a space between portions of the second mask pattern MP2.

Figure 29:
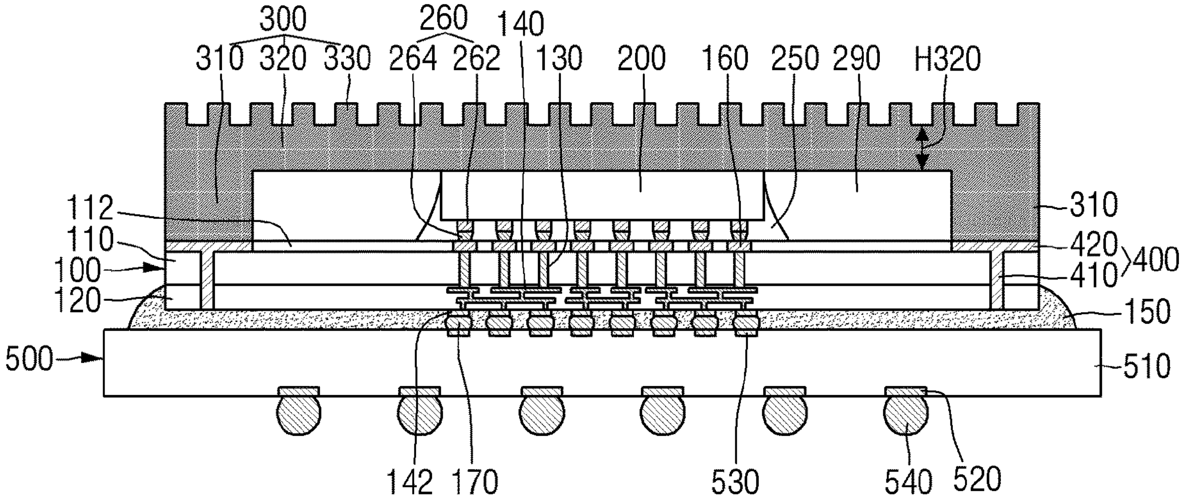

Referring to FIG. 29, the second mask pattern MP2 may be removed. Thus, the roof portion 320 and the protrusion 330 may be formed.

The height H320 of the roof portion 320 in the vertical direction may correspond to a thickness (in the vertical direction) of a portion of the second pre-roof portion 320P2 covered with the second mask pattern MP2. Accordingly, the height H320 of the roof portion 320 may be equal to a second height H320P2 of the second pre-roof portion 320P2.

Although the embodiments of the present disclosure have been described above with reference to the accompanying drawings, the present disclosure may not be limited to the embodiments and may be implemented in various different forms. Those of ordinary skill in the technical field to which the present disclosure belongs will be able to understand that the present disclosure may be implemented in other specific forms without changing the technical idea or essential features of the present disclosure. Therefore, it should be understood that the embodiments as described above are not restrictive but illustrative in all respects.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor package comprising:
- a first semiconductor chip that includes a first semiconductor substrate and a through-via in the first semiconductor substrate;
- a second semiconductor chip on the first semiconductor chip;
- a filler structure extending from a top surface of the first semiconductor chip into the first semiconductor chip; and
- a heat spreader including:
- a column portion on the filler structure, wherein the column portion vertically overlaps the filler structure, wherein the column portion is spaced apart from the second semiconductor chip; and
- a roof portion on the second semiconductor chip, wherein the roof portion is connected to the column portion.

2. The semiconductor package of claim 1, wherein the filler structure includes:
- an extension extending in the first semiconductor chip; and
- a contact portion on the extension,
- wherein the contact portion contacts the column portion, and
- wherein a width of the contact portion in a first direction parallel to the top surface of the first semiconductor chip is greater than a width of the extension in the first direction.

3. The semiconductor package of claim 2, further comprising:
- a first connection bump between the first semiconductor chip and the second semiconductor chip,
- wherein the first semiconductor chip further includes an upper passivation film on the first semiconductor substrate,
- wherein the upper passivation film includes an upper connection pad connected to the first connection bump, and
- wherein the contact portion is, at least partially, in the upper passivation film.

4. The semiconductor package of claim 2, further comprising:
- a first connection bump between the first semiconductor chip and the second semiconductor chip,
- wherein the first semiconductor chip further includes an upper passivation film on the first semiconductor substrate,
- wherein the upper passivation film includes an upper connection pad connected to the first connection bump,
- wherein the contact portion is on the upper passivation film, and
- wherein the extension extends through the upper passivation film.

5. The semiconductor package of claim 1, wherein in a plan view of the semiconductor package, the filler structure and the through-via do not overlap each other.

6. The semiconductor package of claim 1, wherein the heat spreader further includes a protrusion,
- wherein the roof portion includes a bottom surface facing the second semiconductor chip, and a top surface opposite to the bottom surface, and
  - wherein the protrusion protrudes from the top surface of the roof portion.

7. The semiconductor package of claim 1, wherein the first semiconductor chip further includes a second connection bump on a bottom surface of the first semiconductor chip,
- wherein the second connection bump is electrically connected to the through-via, and
- wherein the second connection bump does not overlap with the filler structure.

8. The semiconductor package of claim 1, wherein a bottom surface of the roof portion contacts a top surface of the second semiconductor chip.

9. The semiconductor package of claim 1, wherein the filler structure includes copper (Cu).

10. The semiconductor package of claim 1, wherein a width of the through-via in a first direction parallel to the top surface of the first semiconductor chip and a width of the filler structure in the first direction are equal to each other.

11. A semiconductor package comprising:
- a first semiconductor chip that includes a first semiconductor substrate;
- a second semiconductor chip on the first semiconductor chip;
- a through-via in the first semiconductor substrate;

a filler structure extending from a top surface of the first semiconductor chip into the first semiconductor chip, wherein the filler structure does not overlap with the through-via; and a heat spreader including:

a column portion on the filler structure, wherein the column portion vertically overlaps the filler structure, wherein the column portion is spaced apart from the second semiconductor chip;

a roof portion contacting a top surface of the second semiconductor chip, wherein the roof portion is connected to the column portion; and a protrusion protruding upwardly from a top surface of the roof portion.

12. The semiconductor package of claim 11, wherein in a plan view of the semiconductor package, the roof portion extends across the second semiconductor chip.

13. The semiconductor package of claim 11, wherein in a plan view of the semiconductor package, the roof portion overlaps an entirety of a top surface of the second semiconductor chip.

14. The semiconductor package of claim 11, further comprising:

a first connection bump on a bottom surface of the first semiconductor chip, wherein the first connection bump is electrically connected to the through-via; and a first underfill on the bottom surface of the first semiconductor chip, wherein the first underfill extends around the first connection bump, wherein a bottom surface of the filler structure contacts the first underfill.

15. The semiconductor package of claim 14, further comprising:

a package substrate on the bottom surface of the first semiconductor chip; and a dummy bump between the package substrate and the filler structure, wherein the first underfill is between the first semiconductor chip and the package substrate, and wherein the dummy bump is electrically insulated from the package substrate.

16. The semiconductor package of claim 11, further comprising an upper passivation film on the first semiconductor substrate, wherein the upper passivation film includes an upper connection pad that connects the through-via and the second semiconductor chip to each other, wherein the filler structure includes:

an extension extending in the first semiconductor chip; and a contact portion on the extension, wherein the contact portion contacts the column portion, and wherein a vertical level of a top surface of the contact portion is higher than a vertical level of a top surface of the upper passivation film relative to the first semiconductor substrate.

17. The semiconductor package of claim 16, wherein a width of the contact portion in a first direction parallel to the top surface of the first semiconductor chip is greater than a width of the extension in the first direction.

18. The semiconductor package of claim 11, wherein an inner side surface of the column portion is spaced apart from the second semiconductor chip.

19. The semiconductor package of claim 11, further comprising a second underfill between the first semiconductor chip and the second semiconductor chip.

20. A semiconductor package comprising:

a package substrate;

a first semiconductor chip on the package substrate, wherein the first semiconductor chip includes a through-via;

an underfill between the package substrate and the first semiconductor chip;

a second semiconductor chip on the first semiconductor chip;

a filler structure extending through the first semiconductor chip, wherein the filler structure is spaced apart from the through-via;

a dummy bump in the underfill, wherein the filler structure is on the dummy bump;

a heat spreader including:

a column portion on the filler structure; and a roof portion that contacts a top surface of the second semiconductor chip, wherein the roof portion is connected to the column portion; and a mold layer between the roof portion and the first semiconductor chip, wherein the mold layer is between the second semiconductor chip and the column portion, wherein the heat spreader includes a protrusion protruding from a top surface of the roof portion, wherein the filler structure includes:

an extension extending in the first semiconductor chip; and a contact portion on the extension, wherein the contact portion contacts the column portion, wherein the extension contacts the dummy bump, and wherein the dummy bump is electrically insulated from the package substrate.

* * * * *